(12) United States Patent
Lim et al.

(10) Patent No.: US 11,696,484 B2
(45) Date of Patent: Jul. 4, 2023

(54) DISPLAY DEVICE AND METHOD OF FABRICATING THE SAME

(71) Applicant: Samsung Display Co., Ltd., Yongin-Si (KR)

(72) Inventors: Jaeik Lim, Hwaseong-si (KR);
Gee-Bum Kim, Seoul (KR);
Dae-Young Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/313,573

(22) Filed: May 6, 2021

(65) Prior Publication Data
US 2021/0376015 A1 Dec. 2, 2021

(30) Foreign Application Priority Data

May 27, 2020 (KR) .......................... 10-2020-0063586

(51) Int. Cl.
| | |
|---|---|
| *H01L 27/32* | (2006.01) |
| *H10K 59/65* | (2023.01) |
| *H01L 27/146* | (2006.01) |
| *G06V 40/13* | (2022.01) |
| *H10K 59/12* | (2023.01) |
| *H10K 59/40* | (2023.01) |
| *H10K 71/00* | (2023.01) |

(52) U.S. Cl.
CPC ......... *H10K 59/65* (2023.02); *G06V 40/1318* (2022.01); *H01L 27/14623* (2013.01); *H01L 27/14685* (2013.01); *H10K 59/12* (2023.02); *H10K 59/40* (2023.02); *H10K 71/00* (2023.02); *H10K 59/1201* (2023.02)

(58) Field of Classification Search
CPC .......... H01L 27/3234; H01L 27/14623; H01L 27/14685; H01L 27/323; H01L 27/3244; H01L 51/56; H01L 227/323; G06V 40/1318; H04N 9/04; G02F 1/13318
USPC ........................................................ 348/374
See application file for complete search history.

(56) References Cited

U.S. PATENT DOCUMENTS

| | | |
|---|---|---|
| 10,108,841 B2 | 10/2018 | Lee et al. |
| 10,181,070 B2 | 1/2019 | Smith et al. |
| (Continued) | | |

FOREIGN PATENT DOCUMENTS

CN 110569686 12/2019

*Primary Examiner* — Abdul-Samad A Adediran
(74) *Attorney, Agent, or Firm* — F. Chau & Associates, LLC

(57) ABSTRACT

A display device includes: a display module configured to display an image; and a detection sensor disposed on the display module, wherein the detection sensor includes a base layer, a biometric sensing layer, an optical pattern layer, and a sensing dielectric layer, wherein the biometric sensing layer is disposed on the base layer, wherein the optical pattern layer is disposed on the biometric sensing layer, and the sensing dielectric layer is disposed on the optical pattern layer. The optical pattern layer includes: a plurality of transmission parts that provide the biometric sensing layer with light that is externally incident through the display module; and a light-shield part that at least partially surrounds the plurality of transmission parts. The light-shield part includes a plurality of light-shield patterns that are recessed in a direction toward the base layer.

20 Claims, 20 Drawing Sheets

(56) References Cited

U.S. PATENT DOCUMENTS

2016/0112614 A1* 4/2016 Masuda .................. H04N 9/04
                                                                    348/374
2018/0033835 A1* 2/2018 Zeng ................. G06V 40/1318
2020/0203445 A1* 6/2020 Ou ...................... H01L 27/3218

* cited by examiner

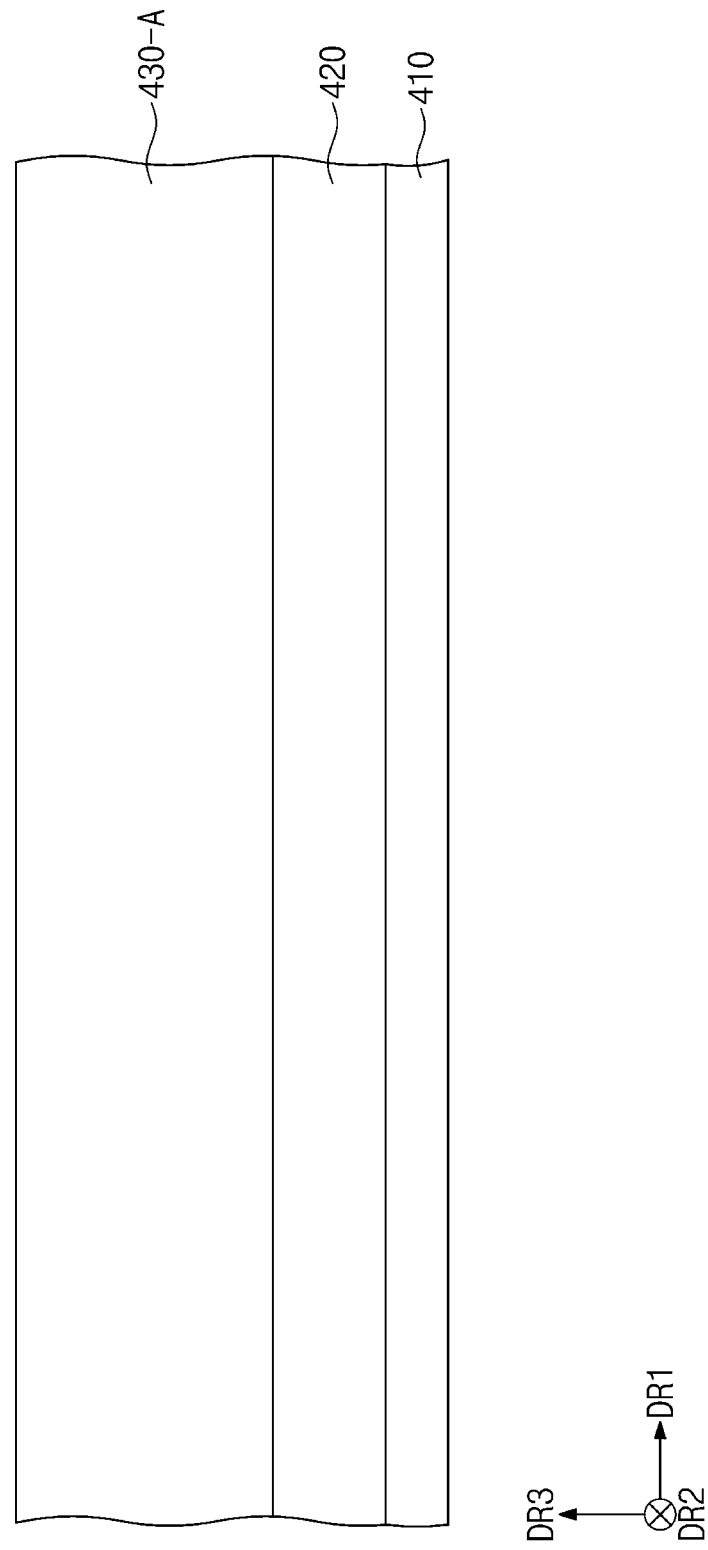

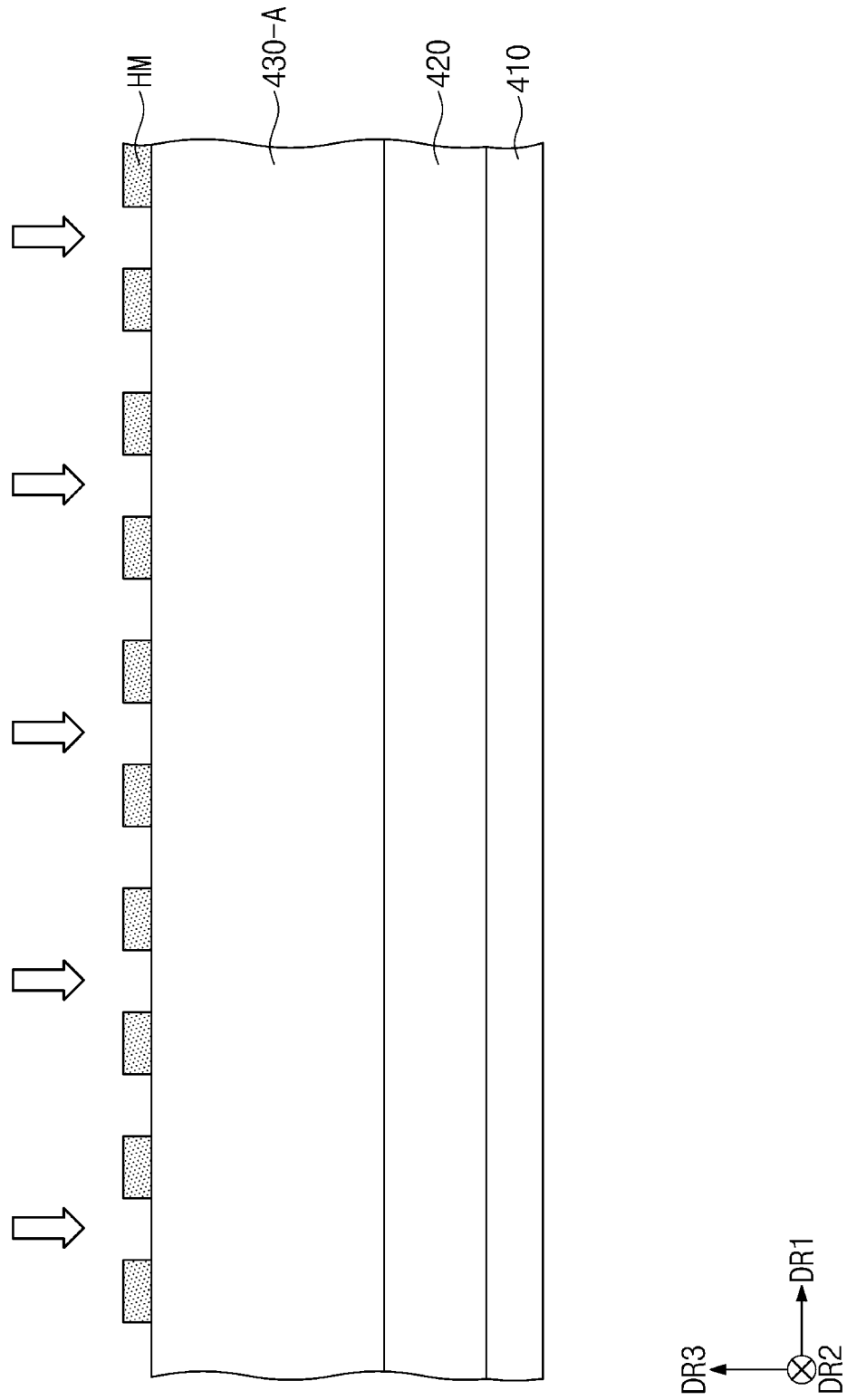

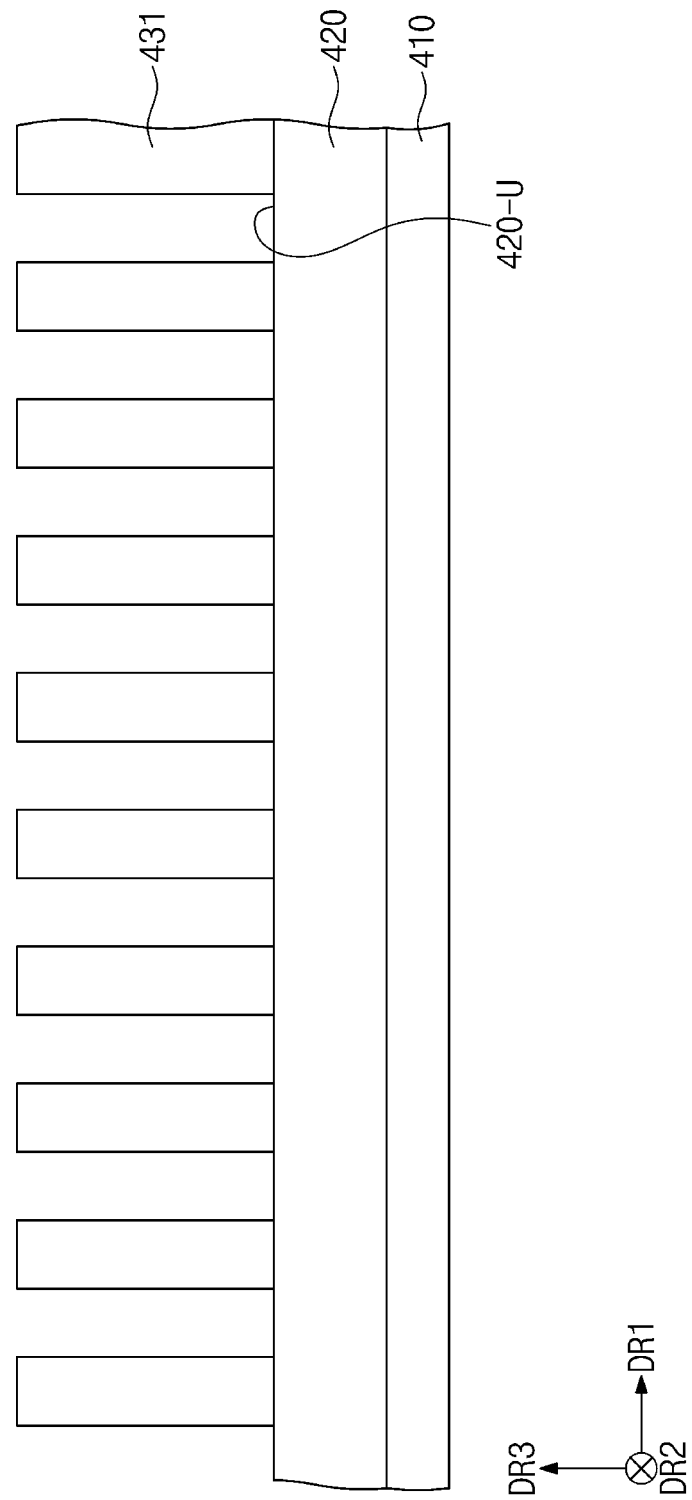

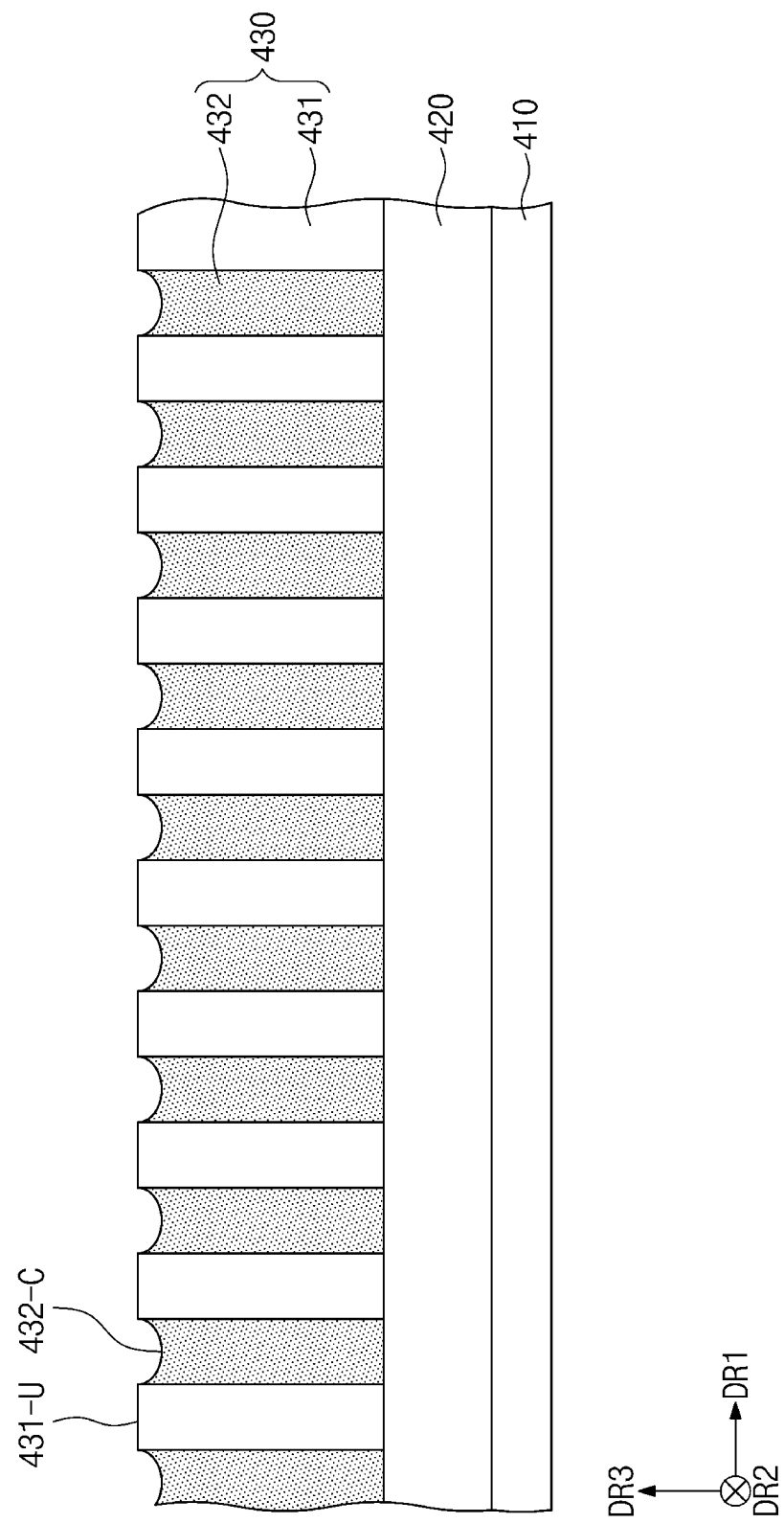

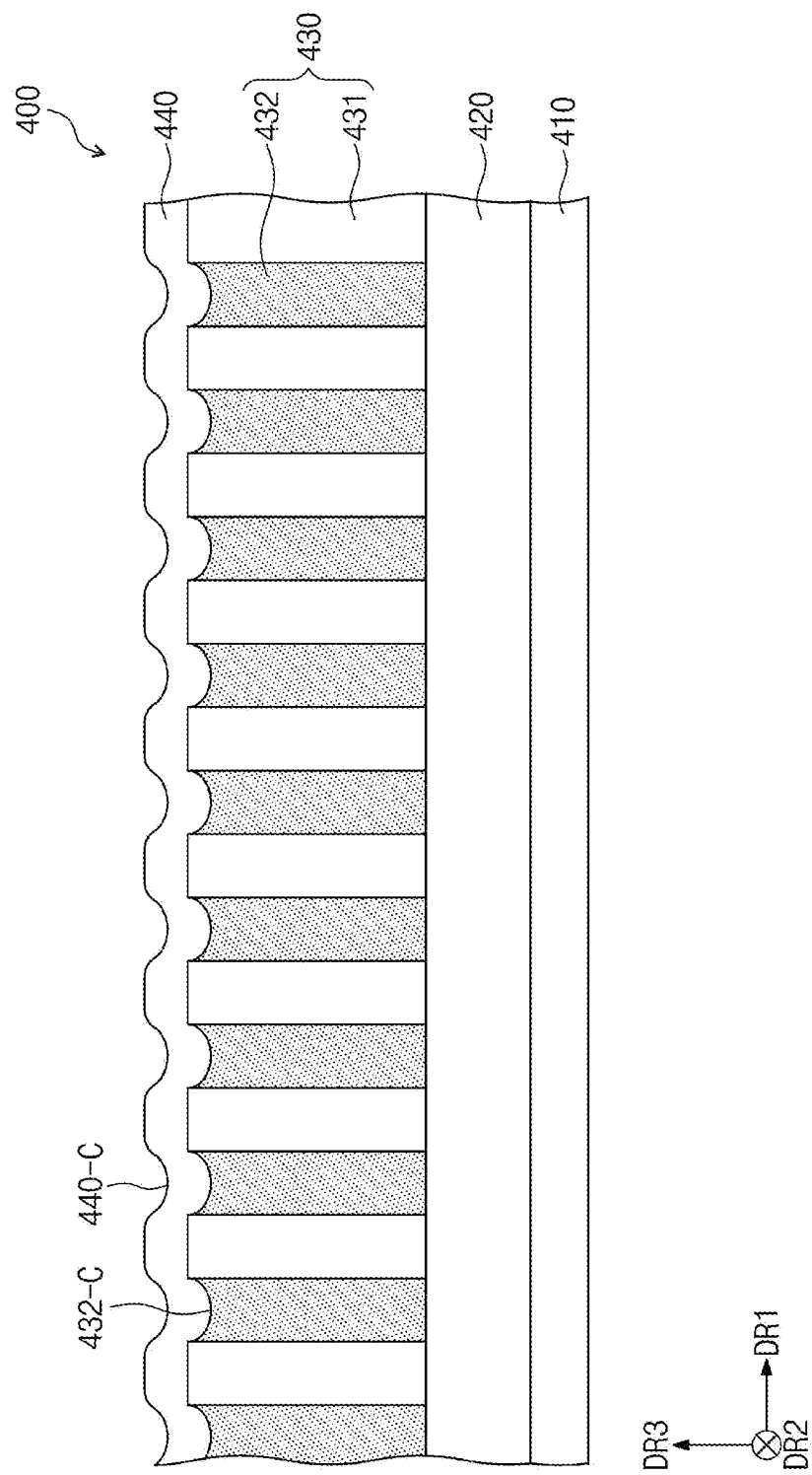

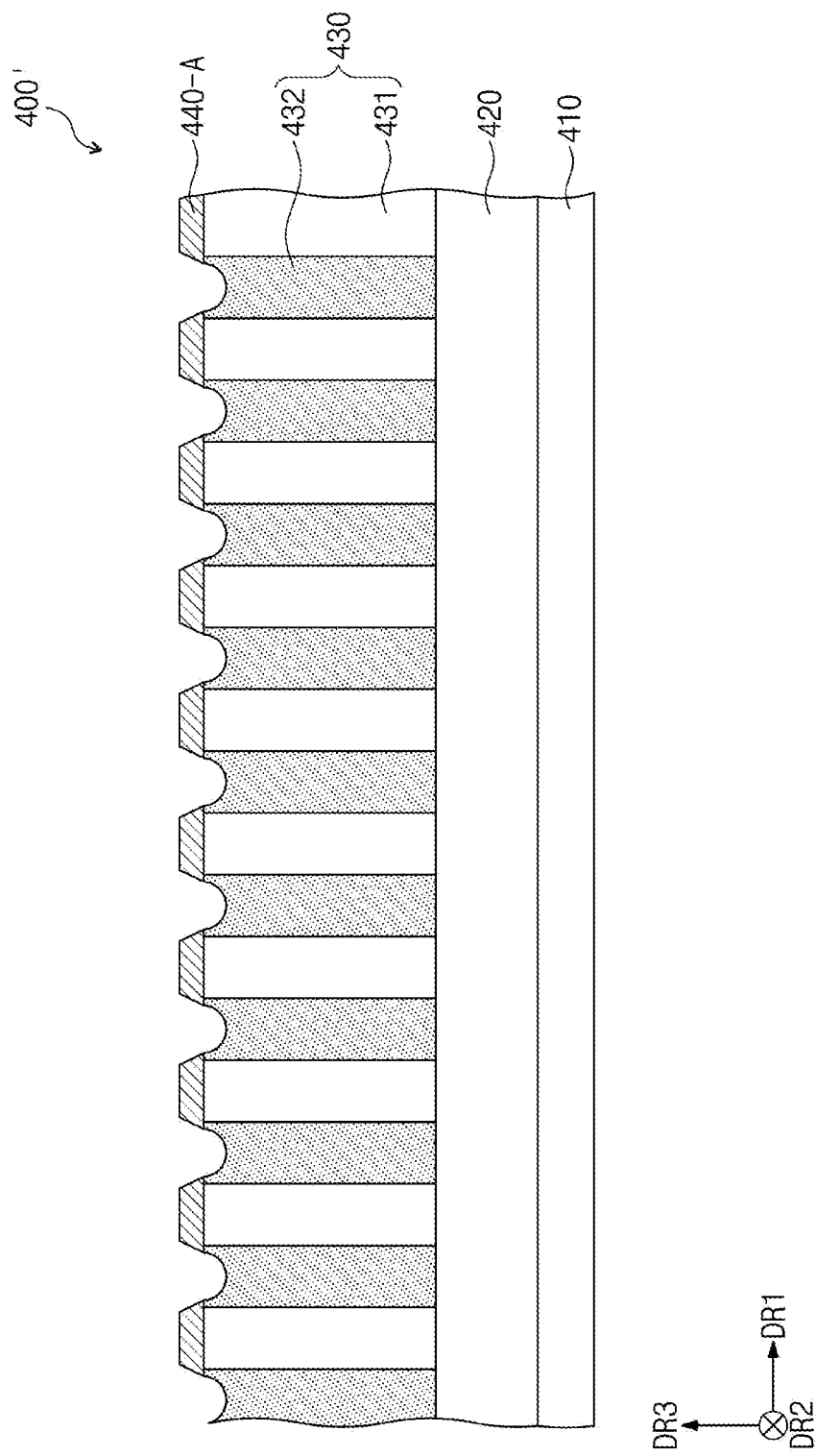

DISPLAY DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2020-0063586 filed on May 27, 2020 in the Korean Intellectual Property Office, the disclosure of which is hereby incorporated by reference herein in its entirety.

TECHNICAL FIELD

The present inventive concept relates to a display device, and more particularly, to a display device including a detection sensor with increased optical transmittance and a method of fabricating the same.

DISCUSSION OF THE RELATED ART

Display devices provide various functions that enable users to interact with display devices. For example, a display device may display an image to provide information to users or may detect a user's inputs, such as a touch input. In addition, some display devices also have the function of detecting a user's fingerprints.

Identification of fingerprints may be achieved through, for example, a capacitive type method based on a variation in capacitance between electrodes. Identification of fingerprints may also be achieved through an optical type method using an optical sensor to detect incident light, or an ultrasonic type method utilizing a piezoelectric material to detect vibration. Further, some display devices include a fingerprint sensor disposed on a rear surface of a display panel of the display device.

SUMMARY

According to an exemplary embodiment of the present inventive concept, a display device includes: a display module configured to display an image; and a detection sensor below the display module, the detection sensor including a base layer, a biometric sensing layer on the base layer, an optical pattern layer on the biometric sensing layer, and a sensing dielectric layer on the optical pattern layer. The optical pattern layer includes: a plurality of transmission parts that provide the biometric sensing layer with light that is externally incident through the display module; and a light-shield part that at least partially surrounds the plurality of transmission parts. The light-shield part includes a plurality of light-shield patterns that are recessed in a direction toward the base layer.

In an exemplary embodiment of the present inventive concept, the sensing dielectric layer includes a plurality of dielectric patterns that are recessed in a same direction in which the light-shield patterns are recessed.

In an exemplary embodiment of the present inventive concept, the dielectric patterns overlap the light-shield patterns.

In an exemplary embodiment of the present inventive concept, when the light is externally incident through the display module, incident light on the light-shield part is refracted at the dielectric patterns and enters the transmission parts.

In an exemplary embodiment of the present inventive concept, the sensing dielectric layer covers the optical pattern layer.

In an exemplary embodiment of the present inventive concept, the sensing dielectric layer is disposed on the transmission parts, overlaps a portion of the light-shield part, and exposes a remaining portion of the light-shield part.

In an exemplary embodiment of the present inventive concept, the sensing dielectric layer disposed on the transmission parts has a polygonal shape.

In an exemplary embodiment of the present inventive concept, when the light is incident through the display module, incident light on the light-shield part is refracted at the sensing dielectric layer and enters the transmission parts.

In an exemplary embodiment of the present inventive concept, a distance from the biometric sensing layer to the light-shield patterns varies.

In an exemplary embodiment of the present inventive concept, each of the light-shield patterns, has a concave shape in a direction toward the base layer.

In an exemplary embodiment of the present inventive concept, the sensing dielectric layer includes at least one of a resin or an inorganic material.

In an exemplary embodiment of the present inventive concept, the transmission parts are disposed on the light-shield part and are spaced apart from each other along a first direction and a second direction that intersects the first direction.

In an exemplary embodiment of the present inventive concept, a refractive index of the sensing dielectric layer is equal to or greater than about 1.65.

In an exemplary embodiment of the present inventive concept, the biometric sensing layer includes: a transistor disposed on the base layer and including a plurality of electrodes; and a sensing element connected to the transistor.

According to an exemplary embodiment of the present inventive concept, a method of fabricating a display device includes: forming a base layer; forming a biometric sensing layer on the base layer; forming an initial optical pattern layer on the biometric sensing layer; patterning the initial optical pattern layer to form a plurality of transmission parts that are spaced apart from each other; coating the base layer with a light-shielding material to form an initial light-shield part; and forming a light-shield part by removing the initial light-shield part formed on the transmission parts. The light-shield part includes a plurality of light-shield patterns each having a concave shape protruding in a direction toward the base layer. The concave shape is disposed ween adjacent transmission parts.

In an exemplary embodiment of the present inventive concept, the method further includes, after forming the light-shield part, forming a sensing dielectric layer that covers the transmission parts and the light-shield part. The sensing dielectric layer includes a plurality of dielectric patterns each having a concave shape protruding in the same direction in which the light-shield patterns protrude.

In an exemplary embodiment of the present inventive concept, the dielectric patterns overlap the light-shield patterns.

In an exemplary embodiment of the present inventive concept, the method further includes, after forming the initial optical pattern layer, forming an initial sensing dielectric layer on the initial optical pattern layer.

In an exemplary embodiment of the present inventive concept, when the initial optical pattern layer is patterned, the initial sensing dielectric layer is simultaneously patterned to form a sensing dielectric layer that covers the transmission parts.

In an exemplary embodiment of the present inventive concept, the sensing dielectric layer includes at least one of a resin or an inorganic material.

BRIEF DESCRIPTION OF THE DRAWINGS

FIG. 9A illustrates a cross-sectional view showing a method of fabricating a detection sensor according to an exemplary embodiment of the present inventive concept.

FIG. 9B illustrates a cross-sectional view showing a method of fabricating a detection sensor according to an exemplary embodiment of the present inventive concept.

FIG. 9C illustrates a cross-sectional view showing a method of fabricating a detection sensor according to an exemplary embodiment of the present inventive concept.

FIG. 9E illustrates a cross-sectional view showing a method of fabricating a detection sensor according to an exemplary embodiment of the present inventive concept.

FIG. 9F illustrates a cross-sectional view showing a method of fabricating a detection sensor according to an exemplary embodiment of the present inventive concept.

FIG. 10F illustrates a cross-sectional view showing a method of fabricating a detection sensor according to an exemplary embodiment of the present inventive concept.

DETAILED DESCRIPTION OF THE EMBODIMENTS

Figure 1:
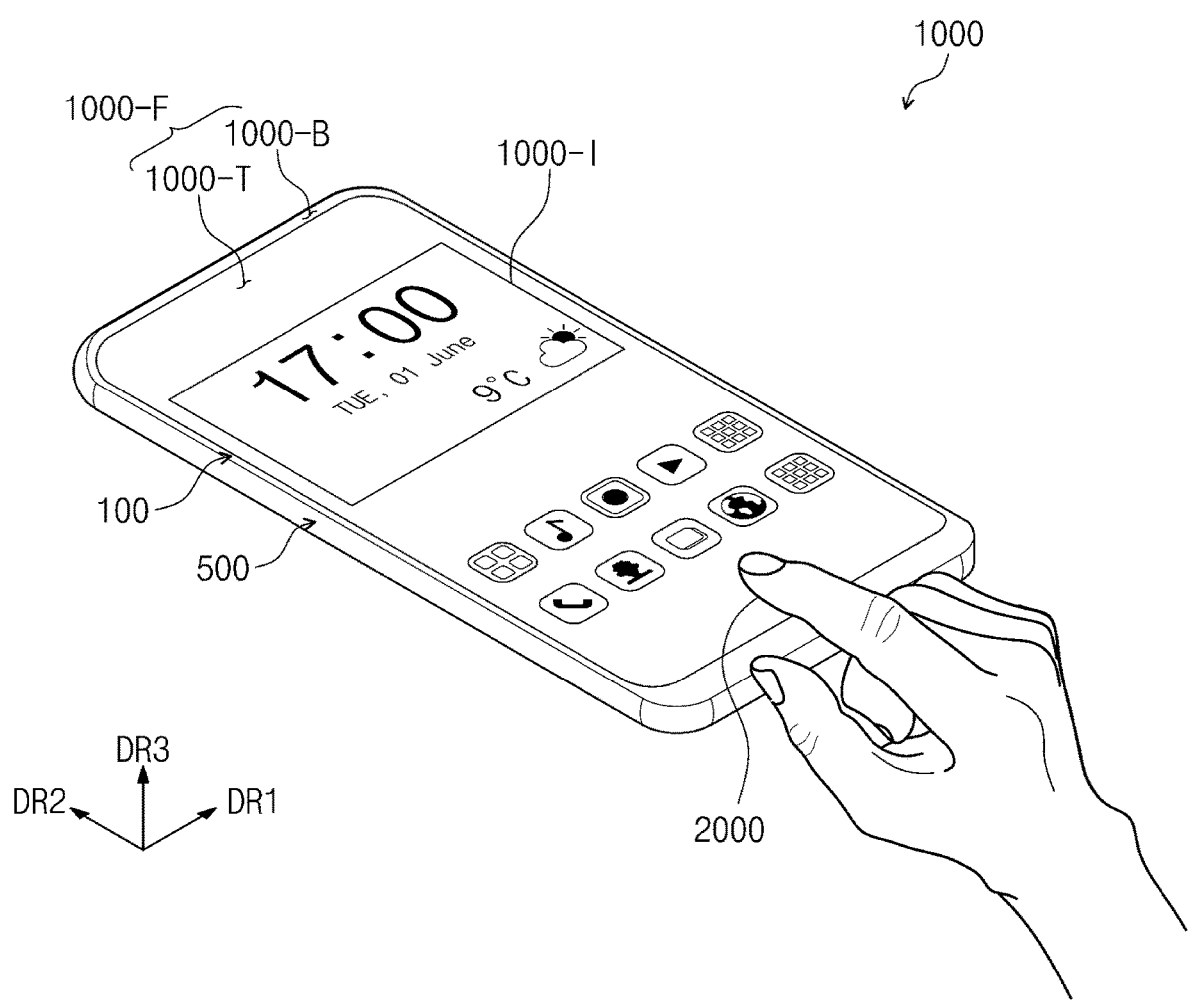
FIG. 1 illustrates a perspective view showing a display device according to an exemplary embodiment of the present inventive concept.

In this specification, when a component (or region, layer, portion, etc.) is referred to as being "on", "connected to", or "coupled to" another component, the component may be directly disposed on, directly connected to, or directly coupled to the other component or at least one intervening component may be present therebetween.

Like numerals may refer to like components throughout the specification, and thus, their description may be omitted. Moreover, in the drawings, thicknesses, ratios, and dimensions of components may be exaggerated for clarity.

It is to be understood that the term "and/or" includes one or more combinations of one or more of the associated listed items.

It will be understood that, although the terms "first", "second", etc. may be used herein to describe various components, these components should not be limited by these terms. These terms are only used to distinguish one component from another component. For example, a first component could be termed a second component, and vice versa without departing from the spirit and scope of the present inventive concept.

It will be understood that, unless the context clearly indicates otherwise, the singular forms of terms are intended to include the plural forms as well.

In addition, spatially relative terms, such as "beneath", "lower", "above", "upper", and the like may be used herein to describe one component's relationship to another component illustrated in the drawings. The relative terms are intended to encompass different orientations in addition to the orientation depicted in the drawings. For example, if the device in the figures is turned over, components described as "beneath" other components or features would then be oriented "above" the other components or features.

Hereinafter, exemplary embodiments of the present inventive concept will be described with reference to the accompanying drawings.

Figure 2:
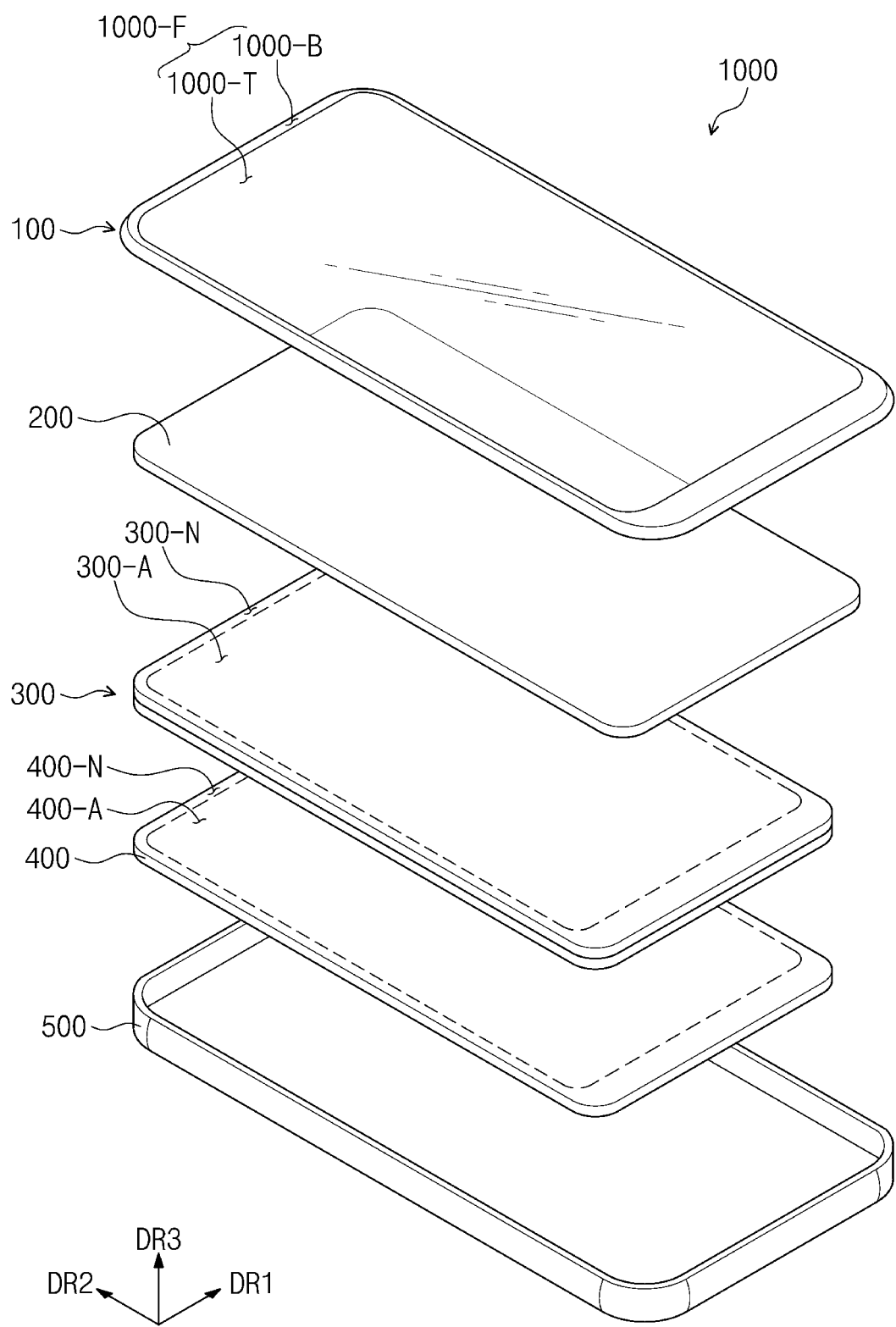
FIG. 2 illustrates an exploded perspective view showing a display device according to an exemplary embodiment of the present inventive concept.

FIG. 1 illustrates a perspective view showing a display device according to an exemplary embodiment of the present inventive concept. FIG. 2 illustrates an exploded perspective view showing a display device according to an exemplary embodiment of the present inventive concept.

A display device 1000 according to an exemplary embodiment of the present inventive concept may be used in various electronic devices. For example, the display device 1000 may be used for relatively large-sized electronic apparatuses such as televisions, monitors, or outdoor billboards, and may also be used for relatively small and medium-sized electronic apparatuses such as personal computers, laptop computers, personal digital terminals, automobile navigation units, game consoles, portable electronic devices, or cameras. These products are presented as examples, and the display device 1080 may be adopted by any electronic apparatus unless the adoption departs from the spirit of the present inventive concept. In an exemplary embodiment of the present inventive concept, a smart phone is illustrated by way of example as the display device 1000.

The display device 1000 may display an image 1000-I in a third direction DR3 on a display surface 1000-F parallel to both a first direction DR1 and a second direction DR2. The image 1000-I may include not only dynamic images but also static images. FIG. 1 depicts a clock window and icons as examples of the image 1000-I. The display surface 1000-F on which the image 1000-I is displayed may correspond to a flout surface of the display device 1000, and the front surface of the display device 1000 may correspond to a front surface of a window 100.

In an exemplary embodiment of the present inventive concept, front and rear surfaces (or, top and bottom surfaces) of each member may be based on a direction along which the image 1000-I is displayed. The front and rear surfaces may be opposite to each other in the third direction DR3, and a normal direction to each of the front and rear surfaces may be parallel to the third direction DR3. In this specification, the phrase "when viewed on a plane" may mean "when viewed in the third direction DR3."

The display device 1000 according to an exemplary embodiment of the present inventive concept may detect a user's input that is externally applied to the display device 1000. The user's input may include arty inputs that are provided from outside the display device 1000. For example, the user's input may not only include touch from a user's hand or other body parts, but may also include any input (e.g., hovering touch) that approaches or is in the vicinity of the display device 1000. In addition, the user's input may include force, pressure, light, or any other types of inputs, but the present inventive concept is not limited thereto. In an exemplary embodiment of the present inventive concept, depending on a structure of the display device 1000, the display device 1000 may detect a user's input that is applied to a lateral or rear surface of the display device 1000, but the present inventive concept is not limited thereto.

The display device 1000 may detect a user's fingerprint 2000 that is externally applied. A fingerprint recognition section may be provided on the display surface 1000-F of the display device 1000. The fingerprint recognition section may be provided on all or a part of a transmission area 1000-T of the display surface 1000-F, but the present inventive concept is not limited to thereto.

The display device 1000 may include a window 100, an antireflection panel 200, a display module 300, a detection sensor 400, and a housing 500. In an exemplary embodiment of the present inventive concept, the window 100 and the housing 500 may be coupled to each other to enclose the display device 1000.

The window 100 may include an optically transparent dielectric material. For example, the window 100 may include glass or plastic. The window 100 may have a single-layered or multi-layered structure. For example, the window 100 may include either a plurality of plastic films that are coupled together through an adhesive, or a glass substrate and a plastic film that are coupled together through an adhesive.

As discussed above, the front surface of the window 100 may provide the display surface 1000-F (or, e.g., the front surface) of the display device 1000. The transmission area 1000-T may be an optically transparent region. For example, the transmission area 1000-T may be a region whose visible-light transmittance is equal to or greater than about 90%.

A bezel area 1000-B of the display surface 1000-F may be a region whose optical transmittance is relatively lower than that of the transmission area 1000-T. The bezel area 1000-B may provide a shape for the transmission area 1000-T. The bezel area 1000-B may be adjacent to and may at least partially surround the transmission area 1000-T.

The bezel area 1000-B may, for example, have a certain color. The bezel area 1000-B may cover a peripheral area 300-N of the display module 300 and may prevent the peripheral area 300-N from being externally visible. This, however, is illustrated by way of example, and the bezel area 1000-B may be omitted from the window 100 according to an exemplary embodiment of the present inventive concept.

The antireflection panel 200 may be disposed below the window 100. The antireflection panel 200 may reduce a reflectance of external light that is incident from outside the window 100. In an exemplary embodiment of the present inventive concept, the antireflection panel 200 may be omitted or may be a component included in the display module 300.

The display module 300 may display the image 1000-I and may detect an external input. The display module 300 may include an active area 300-A and a peripheral area 300-N. The active area 300-A may be a region activated with an electrical signal.

In an exemplary embodiment of the present inventive concept, the active area 300-A may be a region that displays the image 1000-I and also detects an external input. The transmission area 1000-T may overlap the active area 300-A. For example, the transmission area 1000-T may overlap the entirety of or at least a portion of the active area 300-A. Accordingly, users may recognize the image 1000-I through the transmission area 1000-T and/or may provide an external input through the transmission area 1000-T.

In an exemplary embodiment of the present inventive concept, the active area 300-A may be configured such that a region to display the image 1000-I is separated from a region to detect an external input, but the present inventive concept is not limited thereto.

The peripheral area 300-N may be a region covered with the bezel area 1000-B. The peripheral area 300-N may be adjacent to the active area 300-A. The peripheral area 300-N may at least partially surround the active area 300-A. The peripheral area 300-N may include a drive line or a drive circuit for driving the active area 300-A.

The detection sensor 400 may be disposed below the display module 300. The detection sensor 400 may be a layer to detect user's biometric information. The detection sensor 400 may detect surfaces of a touch of the user. The surface may include surface uniformity or surface morphology. For example, the surface may include information about the user's fingerprint 2000.

The detection sensor 400 may include a sensing area 400-A and a non-sensing area 400-N. The sensing area 400-A may be a region activated with an electrical signal. For example, the sensing area 400-A may be a region to detect biometric information. The non-sensing area 400-N may include a drive line or a drive circuit for driving the sensing area 400-A.

In an exemplary embodiment of the present inventive concept, the sensing area 400-A may overlap the active area 300-A. In this case, fingerprint recognition may be performed on the active area 300-A. For example, the user's fingerprint 2000 may be recognized on a region of the active area 300-A. The present inventive concept, however, is not limited thereto. For example, in an exemplary embodiment of the present inventive concept, the sensing area 400-A of the detection sensor 400 may overlap a portion of the active area 300-A.

The housing 500 may be combined with the window 100. The housing 500 and the window 100 may be coupled to each other to provide an inner space. The inner space may accommodate the display module 300 and the detection sensor 400. The housing 500 may stably protect, from an external impact, components of the display device 1000 that are accommodated in the inner space. The housing 500 may include a material whose rigidity is relatively high. For example, the housing 500 may include one or more of glass, plastics, and/or metal, or may have a plurality of frames and/or plates consisting of any combination of glass, plastics, and metal.

Between the detection sensor 400 and the housing 500, a battery module or the like may be provided to provide power for an overall operation of the display device 1000.

Figure 3:
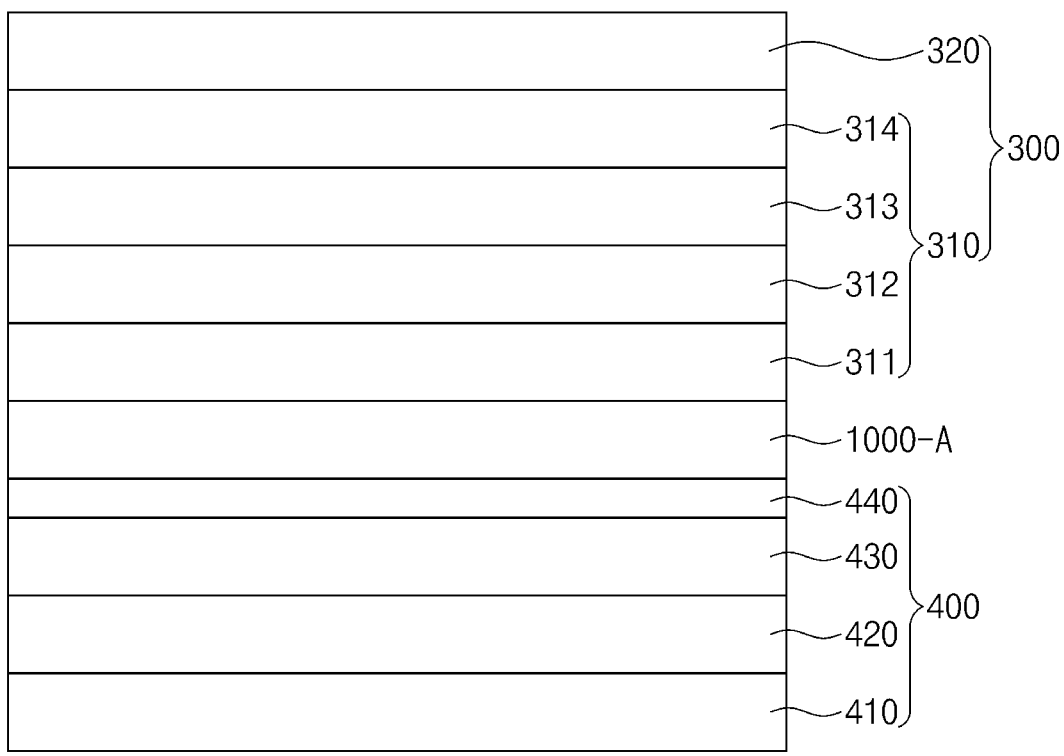
FIG. 3 illustrates a cross-sectional view showing a display device according to an exemplary embodiment of the present inventive concept.
Figure 3:
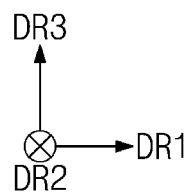
Figure 4:
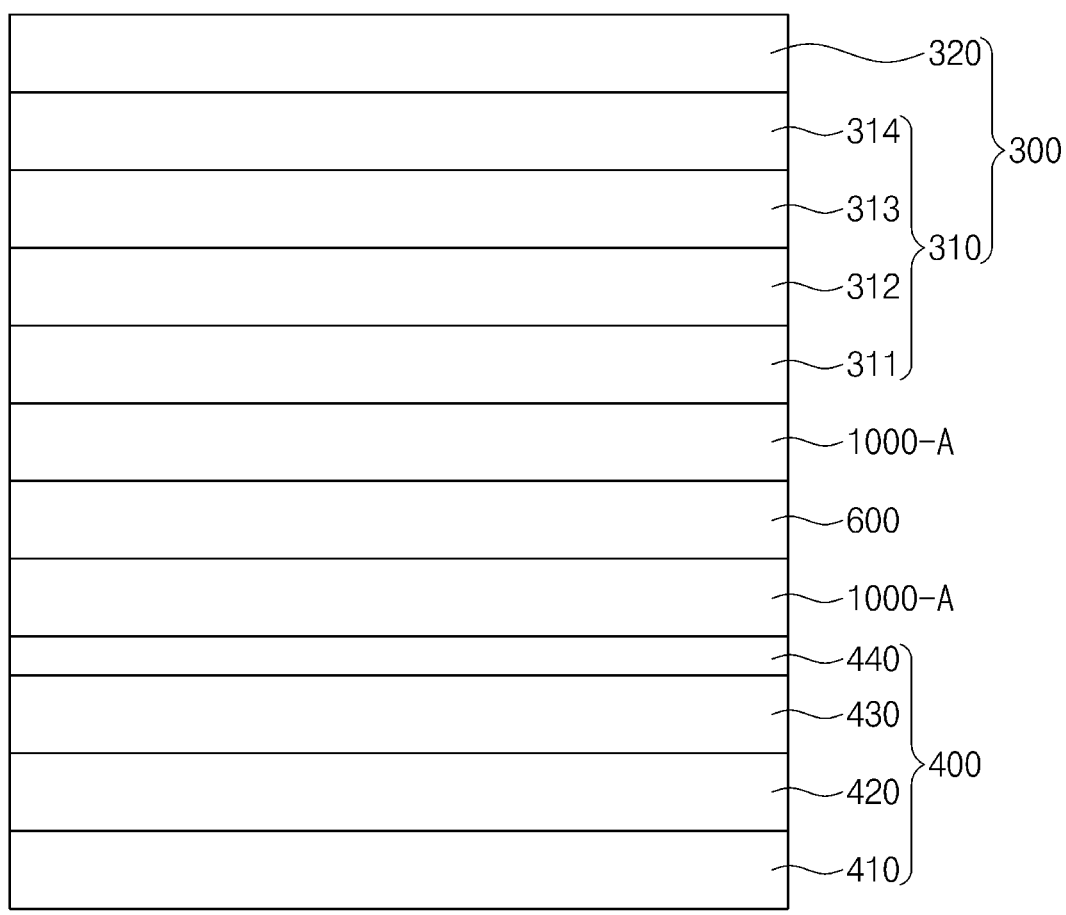
FIG. 4 illustrates a cross-sectional view showing a display device according to an exemplary embodiment of the present inventive concept.
Figure 4:
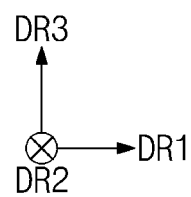

FIG. 3 illustrates a cross-sectional view showing a display device according to an exemplary embodiment of the present inventive concept. FIG. 4 illustrates a cross-sectional view showing a display device according to an exemplary embodiment of the present inventive concept.

Referring to FIG. 3, the display module 300 may include a display panel 310 and an input sensing layer 320.

The display panel 310 may be a layer to provide an image. The active area (see 300-A of FIG. 2) of the display module 300 may correspond to an active area of the display panel 310. For example, the sensing area (see 400-A of FIG. 2) of the detection sensor 400 may overlap the active area of the display panel 310.

The display panel 310 may include a base layer 311, a circuit layer 312, a light-emitting element layer 313, and an encapsulation layer 314.

The base layer 311 may include, for example, a synthetic resin film. The synthetic resin film may include a thermosetting resin. For example, the synthetic resin film may be a polyimide-based resin layer, but no limitation is imposed on the material of the synthetic resin layer. The synthetic resin film may include at least one of acryl-based resin, methacryl-based resin, polyisoprene, vinyl-based resin, epoxy-based resin, urethane-based resin, cellulose-based resin, siloxane-based resin, polyamide-based resin, and/or perylene-based resin. For example, the base layer 311 may include a glass substrate, a metal substrate, or an organic/inorganic composite substrate.

The circuit layer 312 may be disposed on the base layer 311. The circuit layer 312 may include a pixel circuit and dielectrics. The pixel circuit may include at least one transistor and at least one capacitor.

The light-emitting element layer 313 may be disposed on the circuit layer 312. The light-emitting element layer 313 may generate light. In accordance with an electrical signal, the light-emitting element layer 313 may produce light or may control an amount of light. When the display panel 310 is an organic light emitting display panel, the light-emitting element layer 313 may include an organic light emitting material. When the display panel 310 is a quantum-dot light emitting display panel, the light-emitting element layer 313 may include a quantum dot, a quantum rod, or the like.

The encapsulation layer 314 may be disposed on the light-emitting element layer 313. The encapsulation layer 314 may include at least one dielectric layer. For example, the encapsulation layer 314 may include at least one inorganic layer and at least one organic layer. The inorganic layer may protect the light-emitting element layer 313 against moisture and oxygen, and the organic layer may protect the light-emitting element layer 313 against foreign substances such as dust particles.

The input sensing layer 320 may be disposed on the display panel 310. The input sensing layer 320 may detect an external input to obtain information about position of the external input. The external input may include various examples. For example, the external input may include a user's body part, light, heat, pressure, or any various type of inputs. In addition, the input sensing layer 320 may detect not only an input in contact with the window (see 100 of FIG. 2), but also an input that approaches or is close to the window 100.

The input sensing layer 320 may be disposed on the display panel 310. For example, the input sensing layer 320 may be directly disposed on the display panel 310. For example, the input sensing layer 320 and the display panel 310 may be formed in a successive process. In an exemplary embodiment of the present inventive concept, the input sensing layer 320 may be attached to the display panel 310. In this case, an adhesive layer may be disposed between the input sensing layer 320 and the display panel 310.

The detection sensor 400 may be disposed below the display module 300. For example, the detection sensor 400 may be attached to a rear surface of the display panel 310. An adhesive layer 1000-A may be disposed between the detection sensor 400 and the display panel 310. For example, the adhesive layer 1000-A may be provided as one of a pressure sensitive adhesive (PSA), an optical clear adhesive (OCA), and an optical clear resin (OCR).

The present inventive concept, however, is not limited thereto, and one or more functional layers may be disposed between the detection sensor 400 and the display module 300. For example, the one or more functional layers may include one or more of a cushion layer, a light-shield layer, a thermal radiation layer, and/or a shield layer, and the functional layers may have therebetween an adhesive layer whose material is the same as that of the adhesive layer 1000-A.

The detection sensor 400 may include a base layer 410, a biometric sensing layer 420, an optical pattern layer 430, and a sensing dielectric layer 440.

The base layer 410 may include a synthetic resin layer. For example, the synthetic resin layer may include a thermosetting resin. For example, the synthetic resin layer may be a polyimide-based resin layer, but the synthetic resin layer is not limited thereto. In an exemplary embodiment a the present inventive concept, the base layer 410 may include two polyimide-based resin layers and a barrier layer between the polyimide-based resin layers. For example, the barrier layer may include amorphous silicon and silicon oxide.

The biometric sensing layer 420 may be disposed on the base layer 410. The biometric sensing layer 420 may include a sensing circuit and dielectric layers. For example, the sensing circuit may include at least one transistor and at least one photodiode. In an exemplary embodiment of the present inventive concept, the biometric sensing layer 420 may include capacitor circuits.

The optical pattern layer 430 may be disposed on the biometric sensing layer 420. For example, the optical pattern layer 430 may be directly disposed on the biometric sensing layer 420. For example, the optical pattern layer 430 and the biometric sensing layer 420 may be formed in a successive process. The optical pattern layer 430 may filter light that is incident on the biometric sensing layer 420. For example, the optical pattern layer 430 may control an incident angle of light that can pass therethrough. For example, the incident angle may be limited within a certain angle. The limitation of the incident angle may increase accuracy of fingerprint recognition.

The sensing dielectric layer 440 may be disposed on the optical pattern layer 430. The sensing dielectric layer 440 may provide the optical pattern layer 430 with a planarized surface to facilitate assembly with the display module 300. In addition, the sensing dielectric layer 440 may control a refractive index of light that passes through the display module 300 and is provided to the biometric sensing layer 420. The sensing dielectric layer 440 may include at least one of a high-refractive resin and/or an inorganic layer that includes an inorganic material. The inorganic material may include, for example, silicon nitride, silicon oxide, or a compound including a combination thereof. The inorganic layer may be formed by deposition. According to the present inventive concept, the sensing dielectric layer 110 may have a refractive index equal to or greater than about 1.65.

FIG. 4 illustrates a cross-sectional view showing some components of a display device according to an exemplary embodiment of the present inventive concept. In the embodiment of FIG. 4, differences from FIG. 3 be described in detail while the same or similar components, which are allocated the same reference numerals thereto, may not be explained.

Referring to FIG. 4, an infrared filter 600 may be disposed between the display module 300 and the detection sensor 400. The infrared filter 600 may disallow an infrared ray to pass therethrough and may allow a visible ray to pass therethrough.

The light reflected from the user's fingerprint (see 2000 of FIG. 1) may be a ray of light. According to an exemplary embodiment of the present inventive concept, as the infrared filter 600 blocks light having a wavelength range other than that of the light reflected from the fingerprint 2000, the biometric sensing layer 420 may achieve an increase in accuracy of fingerprint recognition.

The adhesive layer 1000-A may be disposed between the infrared filter 600 and the display module 300 and between die infrared filter 600 and the detection sensor 400.

Figure 5:
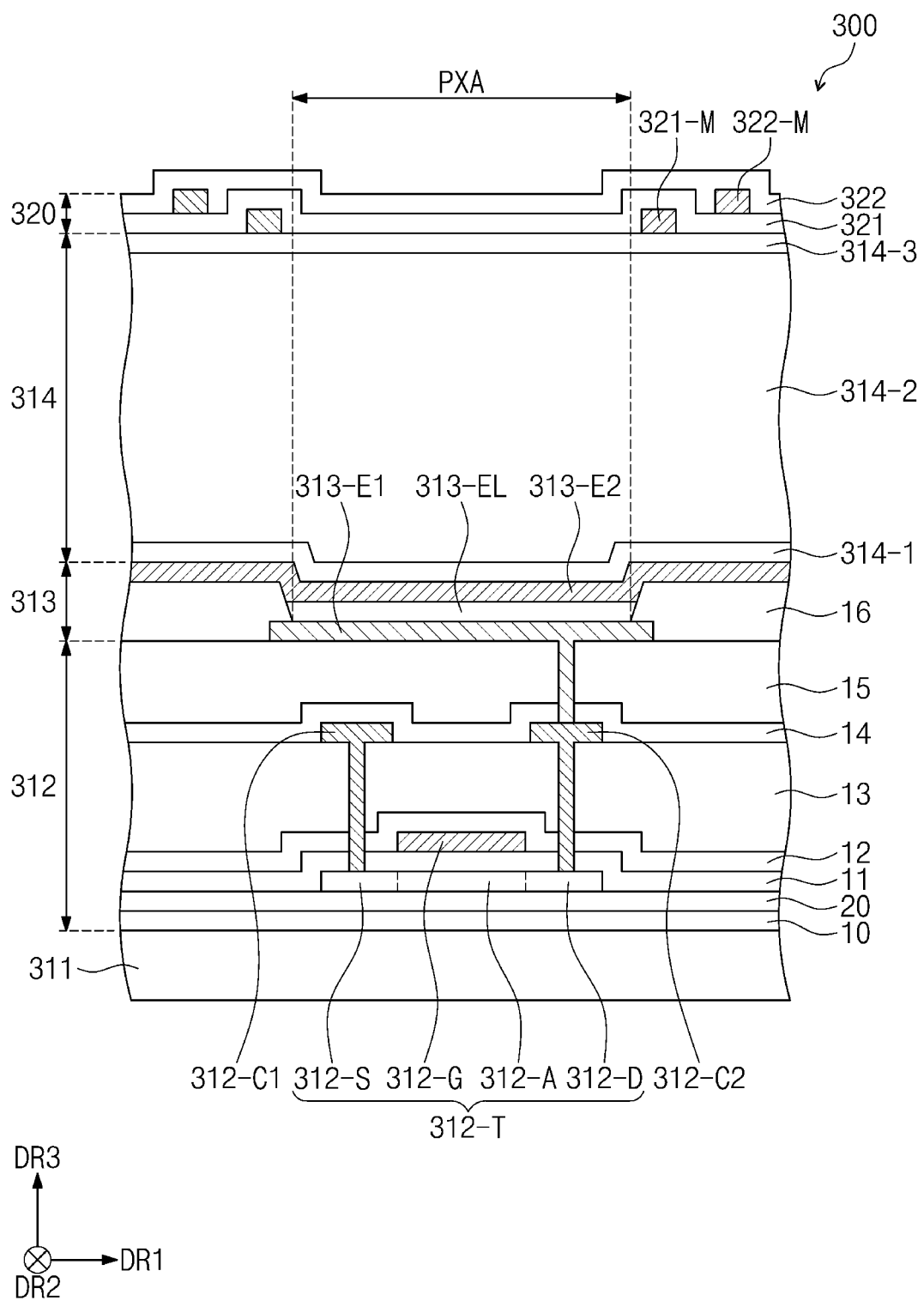
FIG. 5 illustrates a cross-sectional view showing a display module according to an exemplary embodiment of the present inventive concept.

FIG. 5 illustrates a cross-sectional view showing the display module 300 according to an exemplary embodiment of the present inventive concept.

Referring to FIG. 5, the display module 300 may be configured such that the circuit layer 312, the light-emitting element layer 313, the encapsulation layer 314, and the input sensing layer 320 are sequentially disposed on the base layer 311.

A barrier layer 10 may be disposed on the base layer 311. The barrier layer 10 may prevent introduction of foreign substances from outside. The barrier layer 10 may include one or more of a silicon oxide layer and/or a silicon nitride layer. Each of the silicon oxide layer and the silicon nitride layer may be provided in plural, and the silicon oxide layers and the silicon nitride layers may be alternately stacked.

A buffer layer 20 may be disposed on the barrier layer 10. The buffer layer 20 may increase a bonding force between the base layer 311 and at least one of a semiconductor pattern and/or a conductive pattern. The buffer layer 20 may include one or more of a silicon oxide layer and/or a silicon nitride layer. The silicon oxide layer and the silicon nitride layer may be alternately stacked.

The buffer layer 20 may be provided thereon with a transistor 312-T of a pixel circuit. The transistor 312-T may include an active 312-A, a source 312-S, a drain 312-D, and a gate 312-G.

A semiconductor pattern 312-S, 312-A, and 312-D may be disposed on the buffer layer 20. For example, the semiconductor pattern 312-S, 312-A, and 312-D disposed on the buffer layer 20 may include a silicon semiconductor, a polysilicon semiconductor, or an amorphous silicon semiconductor. The semiconductor pattern 312-S, 312-A, and 312-D may have an electrical property that is determined based on whether being doped or not. The semiconductor pattern 312-S, 312-A, and 312-D may include a doped region and an undoped region. The doped region may be implanted with n-type or p-type impurities. A p-type transistor may include a doped region implanted with p-type impurities.

The doped region of the semiconductor pattern 312-S, 312-A, and 312-D may have its conductivity greater than that of the undoped region of the semiconductor pattern 312-S, 312-A, and 312-D, and may substantially serve as an electrode or a signal line. The undoped region of the semiconductor pattern 312-S, 312-A, and 312-D may substantially correspond to an active (or, e.g., a channel) of a transistor. For example, in the semiconductor pattern 312-S, 312-A, and 312-D, a portion may be the active 312-A of the transistor 312-T, another portion may be either the source 312-S or the drain 312-D of the transistor 312-T, and a remaining portion may be a connection signal line or a connection electrode. For example, the active 312-A may be between the source 312-S and the drain 312-D.

A first dielectric layer 11 may be disposed on the buffer layer 20 and may cover the semiconductor pattern 312-S, 312-A, and 312-D. The first dielectric layer 11 may be one or more of an inorganic layer and/or an organic layer, and may have a single-layered or multi-layered structure. The first dielectric layer 11 may include at least one of aluminum oxide, titanium oxide, silicon oxide, silicon oxynitride, zirconium oxide, and/or hafnium oxide. In an exemplary embodiment of the present inventive concept, the first dielectric layer 11 may be a single-layered silicon oxide layer. An inorganic layer which will be discussed below may include at least one of the materials discussed above.

The gate 312-G may be disposed on the first dielectric layer 11. The gate 312-G may be a portion of a metal pattern. When viewed on a plane, the gate 312-G may overlap the active 312-A. The gate 312-G may serve as a mask in a process where a semiconductor pattern is doped.

A second dielectric layer 12 may be disposed on the first dielectric layer 11 and may cover the gate 312-G. The second dielectric layer 12 may be an inorganic layer, and may have a single-layered or multi-layered structure. In an exemplary embodiment of the present inventive concept, the second dielectric layer 12 may be a single-layered silicon oxide layer.

A third dielectric layer 13 may be disposed on the second dielectric layer 12. The third dielectric layer 13 may be an organic layer, and may have a single-layered or multi-layered structure. For example, the third dielectric layer 13 may be a single-layered polyimide-based resin layer. The present inventive concept, however, is not limited thereto, and the third dielectric layer 13 may include at least one of acryl-based resin, methacryl-based resin, polyisoprene, vinyl-based resin, epoxy-based resin, urethane-based resin, cellulose-based resin, siloxane-based resin, polyamide-based resin, and/or perylene-based resin. An organic layer which will be discussed below may include at least one of the materials discussed above.

A first connection electrode 312-C1 and a second connection electrode 312-C2 may be disposed on the third dielectric layer 13. Each of the first and second connection electrodes 312-C1 and 312-C2 may penetrate the first, second, and third dielectric layers 11, 12, and 13, and may each have an electrical connection with the transistor 312-T.

A fourth dielectric layer 14 may be disposed on the third dielectric layer 13 and may cover the first and second connection electrodes 312-C1 and 312-C2. For example, the fourth dielectric layer 14 may be an inorganic layer.

A fifth dielectric layer 15 may be disposed on the fourth dielectric layer 14. For example, the fifth dielectric layer 15 may be an organic layer and may have a single-layered or multi-layered structure.

The light-emitting element layer 313 may be disposed on the fifth dielectric layer 15. The light-emitting element layer 313 may include a first electrode 313-E1, an emission layer 313-EL, and a second electrode 313-E2.

The first electrode 313-E1 may penetrate the fourth and fifth dielectric layers 14 and 15, and may have an electrical connection with the transistor 312-T.

A pixel definition layer 16 may be disposed on the fifth dielectric layer 15. The pixel definition layer 16 may include an opening that exposes the first electrode 313-E1. When viewed on a plane, the opening may have a shape that corresponds to that of a pixel area PXA. For example, the opening of the pixel definition layer 16 may form the pixel area PXA.

Figure 6:
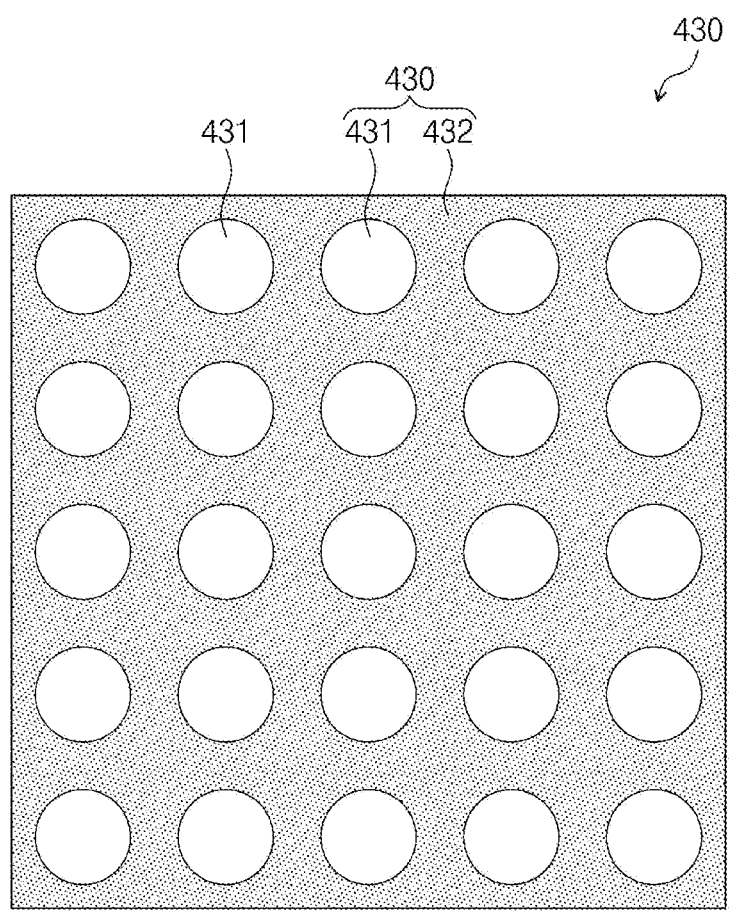
FIG. 6 illustrates a plan view showing an optical pattern layer according to an exemplary embodiment of the present inventive concept.
Figure 6:
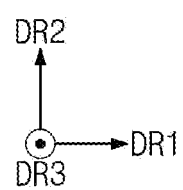

The light that has passed through the opening of the pixel definition layer 16 may be provided to transmission parts 431 of the optical pattern layer 430 shown in FIG. 6.

The emission layer 313-EL may be disposed on the first electrode 3113-EL The emission layer 313-EL may provide light having a certain color. A patterned single-layered emission layer 313-EL is illustrated by way of example, but the present inventive concept is not limited thereto. For example, the emission layer 313-EL may have a multi-layered structure. In addition, the emission layer 313-EL may extend toward a top surface of the pixel definition layer 16.

The second electrode 313-E2 may be disposed on the emission layer 313-EL. For example, an electron control layer may be disposed between the second electrode 313-E2 and the emission layer 313-EL, and a hole control layer may be disposed between the first electrode 313-E1 and the emission layer 313-EL.

In an exemplary embodiment of the present inventive concept, each of the first and second electrodes 313-E1 and 313-E2 may include a transparent conductive material. For example, each of the first and second electrodes 313-E1 and 313-E2 may include at least one of indium tin oxide (ITO), indium zinc oxide (IZO), indium gallium oxide (IGO), indium zinc gallium oxide (IGZO), and a mixture/combination thereof. The present inventive concept, however, is not limited thereto.

The encapsulation layer 314 may be disposed on the second electrode 313-E2. The encapsulation layer 314 may include, for example, a first inorganic layer 314-1, an organic layer 314-2, and a second inorganic layer 314-3.

The first inorganic layer 314-1 may be disposed on the second electrode 313-E2. The organic layer 314-2 may be disposed on the first inorganic layer 314-1. The second inorganic layer 314-3 may be disposed on and may cover the organic layer 314-2. The first and second inorganic layers 314-1 and 314-3 may include, for example, a silicon nitride layer, a silicon oxynitride layer, a silicon oxide layer, a titanium oxide layer, and/or an aluminum oxide layer, but the present inventive concept is not particularly limited thereto. The organic layer 314-2 may include, but may not be particularly limited to, an acryl-based organic layer. The first and second inorganic layers 314-1 and 314-3 may protect the light-emitting element layer 313 against moisture and/or oxygen, and the organic layer 314-2 may protect the light-emitting element layer 313 against foreign substances such as dust particles.

The input sensing layer 320 may be disposed on the encapsulation layer 314. The input sensing layer 320 may include a first conductive layer 321-M, a first sensing dielectric layer 321, a second conductive layer 322-M, and a second sensing dielectric layer 322. One or both of the first and second conductive layers 321-M and 322-M may include sensing electrodes. The input sensing layer 320 may obtain information about external inputs by using a variation in capacitance between the sensing electrodes.

Figure 7:
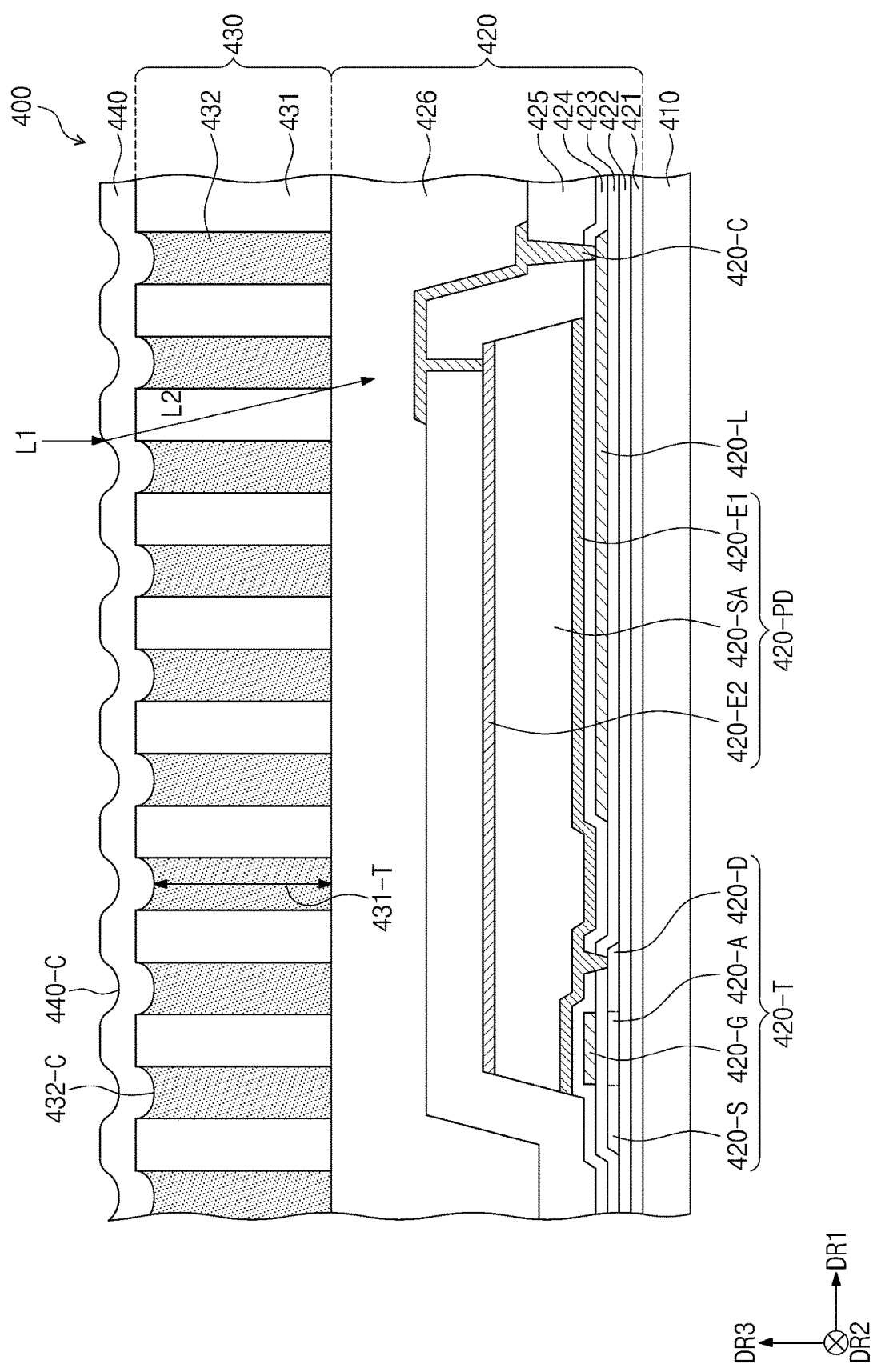
FIG. 7 illustrates a cross-sectional view showing a detection sensor according to an exemplary embodiment of the present inventive concept.

FIG. 6 illustrates a plan view showing an optical pattern layer according to exemplary embodiment of the present inventive concept. FIG. 7 illustrates a cross-sectional view showing a detection sensor according to an exemplary embodiment of the present inventive concept.

Referring to FIGS. 6 and 7, the optical pattern layer 430 of the detection sensor 400 may include transmission parts 431 and a light-shield part 432 that surrounds the transmission parts 431.

Each of the transmission parts 431 may have a circular shape when viewed on a plane. However, the present inventive concept is not limited thereto. For example, each of the transmission parts 431 may have an oval shape, a polygonal shape, or any suitable shapes.

The transmission parts 431 may be arranged along the first direction DR1 and the second direction DR2. For example, the transmission parts 431 may be arranged in a matrix shape. The present inventive concept, however, is not limited thereto. For example, the transmission parts 431 may be arranged in a zigzag fashion such that some transmission parts 431 arranged along the first direction DR1 in a first row are misaligned with other transmission parts 431 in a second row spaced apart in the second direction DR2 from the first row of transmission parts 431, but the present inventive concept is not limited thereto.

The detection sensor 400 may include a base layer 410, a biometric sensing layer 420 disposed on the base layer 410, an optical pattern layer 430 disposed on the biometric sensing layer 420, and a sensing dielectric layer 440 disposed on the optical pattern layer 430. In an exemplary embodiment of the present inventive concept, the sensing dielectric layer 440 may cover a first surface of the optical pattern layer 430. For example, the sensing dielectric layer 440 may cover the front surface of the optical pattern layer 430. The base layer 410 may be the same as the base layer 410 discussed in FIG. 4.

A barrier layer 421 may be disposed on the base layer 410. A buffer layer 422 may be disposed on the barrier layer 421. A description of the barrier layer 421 and the buffer layer 422 may correspond to that of the barrier layer 421 and the buffer layer 422 discussed in FIG. 5.

A transistor 420-T may be disposed on the buffer layer 422. The transistor 420-T may include an active 420-A, a source 420-S, a drain 420-D, and a gate 420-G. The active 420-A, the source 420-G, and the drain 420-D may be disposed on the buffer layer 422.

A first dielectric layer 423 may be disposed on the buffer layer 422 and may cover the active 420-A, the source 420-G, and the drain 420-D. The first dielectric layer 423 may be one or more of an inorganic layer and/or an organic layer, and may have a single-layered or multi-layered structure. In an exemplary embodiment of the present inventive concept, the first dielectric layer 423 may be a single-layered silicon oxide layer.

The gate 420-G and a wiring layer 420-L may be disposed on the first dielectric layer 423. The wiring layer 420-L may be provided with a predetermined voltage, for example, a bias voltage. The wiring layer 420-L may be electrically connected to a sensing element 420-PD, which will be discussed below.

A second dielectric layer 424 may be disposed on the first dielectric layer 423 and may cover the gate 420-G and the wiring layer 420-L. For example, the second dielectric layer 424 may be an inorganic layer and may have a single-layered or multi-layered structure. In an exemplary embodiment of the present inventive concept, the second dielectric layer 424 may be a single-layered silicon oxide layer.

A sensing element 420-PD may be disposed on the second dielectric layer 424. The sensing element 420-PD may be electrically connected to the transistor 420-T and the wiring layer 420-L. For example, an operation of the sensing element 420-PD may be controlled with a signal provided from the transistor 420-T, and the sensing element 420-PD may be provided with a predetermined voltage from the wiring layer 420-L. The sensing element 420-PD may be called a sensor.

The sensing element 420-PD may include a first sensing electrode 420-E1, a sensing layer 420-SA, and a second sensing electrode 420-E2.

The first sensing electrode 420-E1 may penetrate the first and second dielectric layers 423 and 424, and may have an electrical connection with the transistor 420-T. The first sensing electrode 420-E1 may include an opaque conductive material. For example, the first sensing electrode 420-E1 may include molybdenum (Mo).

The sensing layer 420-SA may be disposed on the first sensing electrode 420-E1. The sensing layer 420-SA may include, for example, amorphous silicon.

The second sensing electrode 420-E2 may be disposed on the sensing layer 420-SA. The second sensing electrode 420-E2 may include a transparent conductive material. For example, the second sensing electrode 420-E2 may include indium tin oxide (ITO).

A third dielectric layer 425 may be disposed on the second sensing electrode 420-E2. The third dielectric layer 425 may be an inorganic layer and may have a single-layered or multi-layered structure. For example, the third dielectric layer 425 may include a silicon oxide layer and/or a silicon nitride layer.

A connection electrode 420-C may be disposed on the third dielectric layer 425. The connection electrode 420-C may penetrate the third dielectric layer 425 and may have an electrical connection with the second sensing electrode 420-E2. In addition, the connection electrode 420-C may penetrate the second and third dielectric layers 424 and 425, and may have an electrical connection with the wiring layer 420-L.

A fourth dielectric layer 426 may be disposed on the third dielectric layer 425 and may cover the connection electrode 420-C. For example, the fourth dielectric layer 426 may provide a planarized surface. The fourth dielectric layer 426 may be an organic layer and may have a single-layered or multi-layered structure. For example, the fourth dielectric layer 426 may be a single-layered polyimide-based resin layer.

The optical pattern layer 430 may be disposed on the biometric sensing layer 420. For example, the optical pattern layer 430 may be directly disposed on the biometric sensing layer 420. For example, the optical pattern layer 430 may be directly disposed on the fourth dielectric layer 426. The optical pattern layer 430 and the biometric sensing layer 420 may be formed in a successive process.

According to an exemplary embodiment of the present inventive concept, as the optical pattern layer 430 is disposed on the biometric sensing layer 420, a reduced distance may be provided between the optical pattern layer 430 and the second sensing electrode 420-E2. In conclusion, it may be possible to prevent or reduce interference between light that has passed through the optical pattern layer 430 and other light that has passed through the optical pattern layer 430, which may result in an increase in accuracy of fingerprint recognition.

As discussed above, the optical pattern layer 430 may include the transmission parts 431 and the light-shield part 432 that at least partially surrounds the transmission parts 431. The transmission parts 431 may have optical transparency, and the light-shield part 432 may have light-absorbing characteristics. The light reflected from the fingerprint 2000 may penetrate the transmission parts 431 and may then be incident on the sensing element 420-PD.

The light-shield part 432 according to an exemplary embodiment of the present inventive concept may include light-shield patterns 432-C that are recessed in a direction from the display module 300 toward the detection sensor 400, or in the third direction DR3. For example, the light-shield patterns 432-C may be recessed in a direction toward the base layer 410. Between the transmission parts 431, the light-shield patterns 432-C may each have a concave shape in a direction toward the base layer 410, or in the third direction DR3.

When forming the light-shield patterns 432-C by coating an organic material including a light-shielding material, the size and curvature of the concave shape of each of the light-shield patterns 432-C may be determined by an amount of the organic material and surface tension between the organic material and its adjacent transmission parts 431. As the light-shield patterns 432-C have their concave shapes, a distance 432-T from the biometric sensing layer 420 to the light-shield patterns 432-C in the third direction DR3 may vary and may not be constant. For example, when compared to a periphery of the light-shield pattern 432-C, a center of the light-shield pattern 432-C is closer to the biometric sensing layer 420.

In an exemplary embodiment of the present inventive concept, the sensing dielectric layer 440 may include dielectric patterns 440-C that are recessed in a direction from the display module 300 toward the detection sensor 400, or in the third direction DR3. Therefore, the dielectric patterns 440-C may be recessed in the same direction in which the light-shield patterns 432-C are recessed. In addition, according to an exemplary embodiment of the present inventive concept, the dielectric patterns 440-C may overlap the light-shield patterns 432-C. For example, the dielectric patterns 440-C may be aligned with the light-shield patterns 432-C. The sensing dielectric layer 440 may include at least one of a resin and/or an inorganic material.

The dielectric patterns 440-C may be formed to have their shapes corresponding to those of the light-shield patterns 432-C. On the light-shield patterns 432-C, the sensing dielectric layer 440 may be formed to have dielectric patterns 440-C whose shapes correspond to those of the light-shield patterns 432-C. Therefore, the dielectric patterns 440-C may be disposed on the light-shield patterns 432-C, while overlapping the light-shield part 432 and being spaced apart from the transmission parts 431.

According to an exemplary embodiment of the present inventive concept, as the sensing dielectric layer 440 formed on the optical pattern layer 430 overlaps the light-shield part 432 and includes the concave-shaped dielectric patterns 440-C, when light is provided to the display module 300 disposed above the detection sensor 400, incident light L1 on the light-shield part 432 may be refracted at the dielectric patterns 440-C of the sensing dielectric layer 440 and refracted light L2 may enter the transmission parts 431.

Accordingly, the detection sensor 400 may increase in optical transmittance, and the display device 1000 may increase in accuracy or sensitivity of fingerprint recognition.

Figure 8:
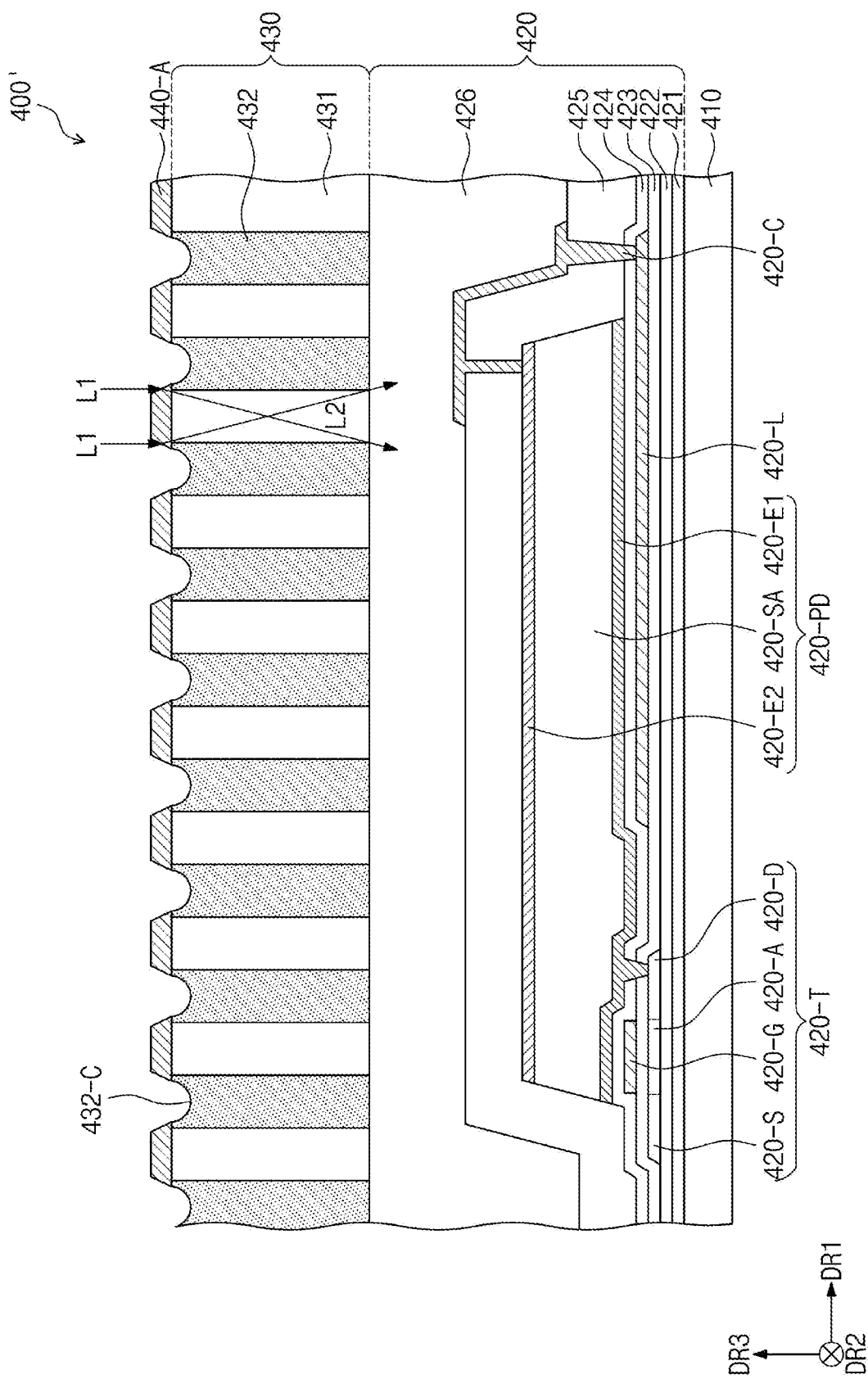
FIG. 8 illustrates a cross-sectional view showing a detection sensor according to an exemplary embodiment of the present inventive concept.

FIG. 8 illustrates a cross-sectional view showing a detection sensor according to an exemplary embodiment of the present inventive concept. In the embodiment of FIG. 8, a base layer 410, a biometric sensing layer 420, and an optical pattern layer 430 may be the same as the base layer 410, the biometric sensing layer 420, and the optical pattern layer 430 of FIG. 7, respectively, and the following description will focus on differences from the embodiment of FIG. 7.

In an exemplary embodiment of the present inventive concept, a detection sensor 400-A may include a patterned sensing dielectric layer 440-A. The sensing dielectric layer 440-A may be disposed on the transmission parts 431, while overlapping a portion of the light-shield part 432 and exposing a remaining portion of the light-shield part 432.

When viewed in cross-section, the sensing dielectric layer 440-A may have a polygonal shape. For example, the sensing dielectric layer 440-A may have a trapezoidal shape. When viewed in cross-section, a long side (or, e.g., base) of the trapezoidal shape may be larger than a width in the first direction DR1 of the transmission part 431. Therefore, a portion of the trapezoid-shaped sensing dielectric layer 440-A may overlap a portion of the light-shield part 432.

According to an exemplary embodiment of the present inventive concept, as the sensing dielectric layer 440-A has a protruding shape to overlap a portion of the light-shield part 432, when light is provided to the display module 300, incident light L1 on the light-shield part 432 may be refracted at the sensing dielectric layer 440-A and refracted light L2 may enter the transmission parts 431.

Accordingly, the detection sensor 400-A may increase in optical transmittance, and the display device 1000 may increase in accuracy or sensitivity of fingerprint recognition.

Figure 9D:
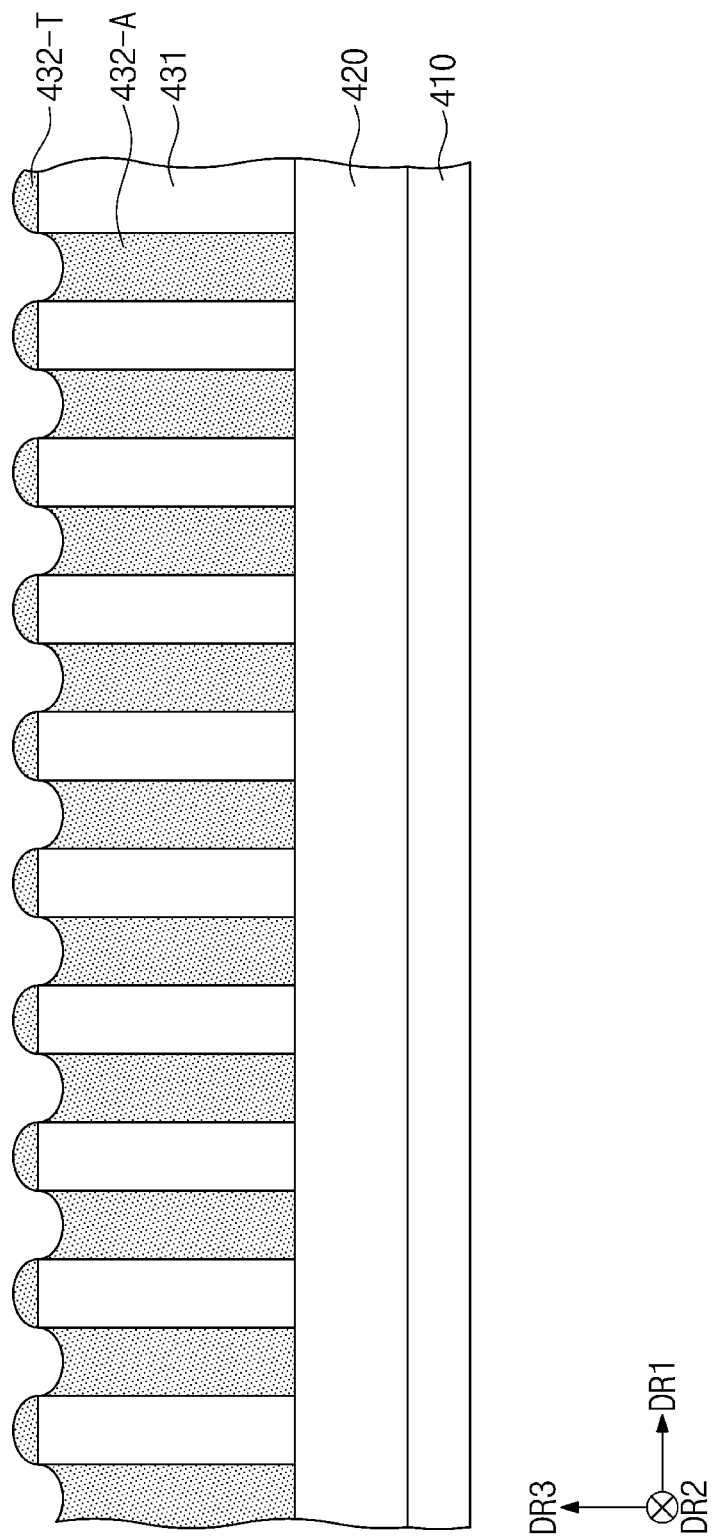
FIG. 9D illustrates a cross-sectional view showing a method of fabricating a detection sensor according to an exemplary embodiment of the present inventive concept.

FIG. 9A illustrates a cross-sectional view showing a method of fabricating a detection sensor according to an exemplary embodiment of the present inventive concept. FIG. 9B illustrates a cross-sectional view showing a method of fabricating a detection sensor according to an exemplary embodiment of the present inventive concept. FIG. 9C illustrates a cross-sectional view showing a method of fabricating a detection sensor according to an exemplary embodiment of the present inventive concept. FIG. 9D illustrates a cross-sectional view showing a method of fabricating a detection sensor according to an exemplary embodiment of the present inventive concept. FIG. 9E illustrates a cross-sectional view showing a method of fabricating a detection sensor according to an exemplary embodiment of the present inventive concept. FIG. 9F illustrates a cross-sectional view showing, a method of fabricating, a detection sensor according to an exemplary embodiment of the present inventive concept.

The same reference numerals are allocated to components identical or similar to those of FIGS. 1 to 7, and a repetitive description will be omitted. With reference to FIGS. 9A to 9F, the following will describe a method of fabricating a display device including a detection sensor according to an exemplary embodiment of the present inventive concept.

Referring to FIG. 9A, a method of fabricating a display device according to an exemplary embodiment of the present inventive concept may include a step of providing an initial optical pattern layer 430-A.

The initial optical pattern layer 430-A may be formed in a successive process on a biometrics sensing layer 420 formed on a base layer 410. The initial optical pattern layer 430-A may include a material that allows light to pass therethrough. There is no limitation on the material of the initial optical pattern layer 430-A as long as the material allows light to pass therethrough.

Referring to FIGS. 9B and 9C, the method may include a step of forming a plurality of transmission parts 431.

The plurality of transmission parts 431 may be formed by placing a hardmask HM on the initial optical pattern layer 430-A and etching the initial optical pattern layer 430-A. The hardmask HM may include an inorganic material. The removal of the initial optical pattern layer 430-A may expose a top surface 420-U of the biometric sensing layer 420. After etching the initial optical pattern layer 430-A, the hardmask HM may be removed. The formation of the transmission parts 431 may involve a photolithography process or a nano-imprint process.

Referring to FIG. 9D, the method may include a step of forming an initial light-shield part 432-A and 432-T. The initial light-shield part 432-A and 432-T may be formed by coating the base layer 410 with an organic material that blocks light. The organic material may be formed into an initial light-shield part 432-A, which is filled between neighboring transmission parts 431, and an initial light-shield part 432-T, which is coated on the transmission parts 431.

Referring to FIG. 9E, the method may include a step of forming a light-shield part 432. The light-shield part 432 may be formed by physically removing the initial light-shield part 432-T coated on the transmission parts 431. The removal of the initial light-shield part 432-T may expose top surfaces 431-U of the transmission parts 431. An optical pattern layer 430 may be constituted by the transmission parts 431 and the light-shield part 432 that surrounds the transmission parts 431.

According to an exemplary embodiment of the present inventive concept, surface tension between the organic material and its adjacent transmission parts 431 may cause the initial light-shield part 432-A, which includes the organic material filled between neighboring transmission parts 431, to form into light-shield patterns 432-C each having a concave shape in a direction toward the base layer 410.

Referring to FIG. 9F, the method may further include a step of forming a sensing dielectric layer 440. The sensing dielectric layer 440 may be formed by coating one of a resin and/or an inorganic material on the optical pattern layer 430. Therefore, the sensing dielectric layer 440 may cover the transmission parts 431 and the light-shield part 432.

As the sensing dielectric layer 440 is formed on the optical pattern layer 430, dielectric patterns 440-C may be formed to overlap the light-shield patterns 432-C and to have concave shapes that are recessed in the same direction in which the light-shield patterns 432-C are recessed. As such, a detection sensor 400 may be fabricated.

Figure 10A:
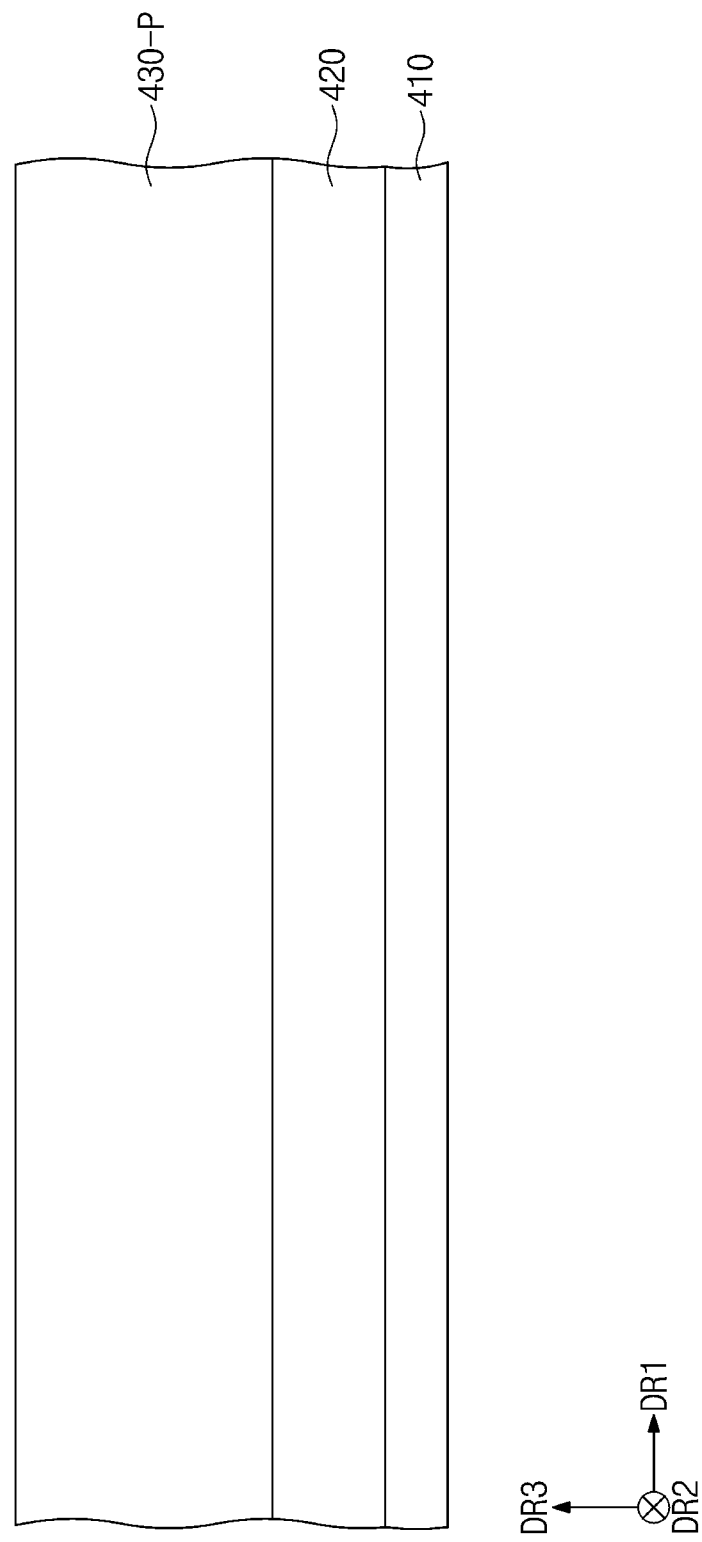
FIG. 10A illustrates a cross-sectional view showing a method of fabricating a detection sensor according to an exemplary embodiment of the present inventive concept.
Figure 10B:
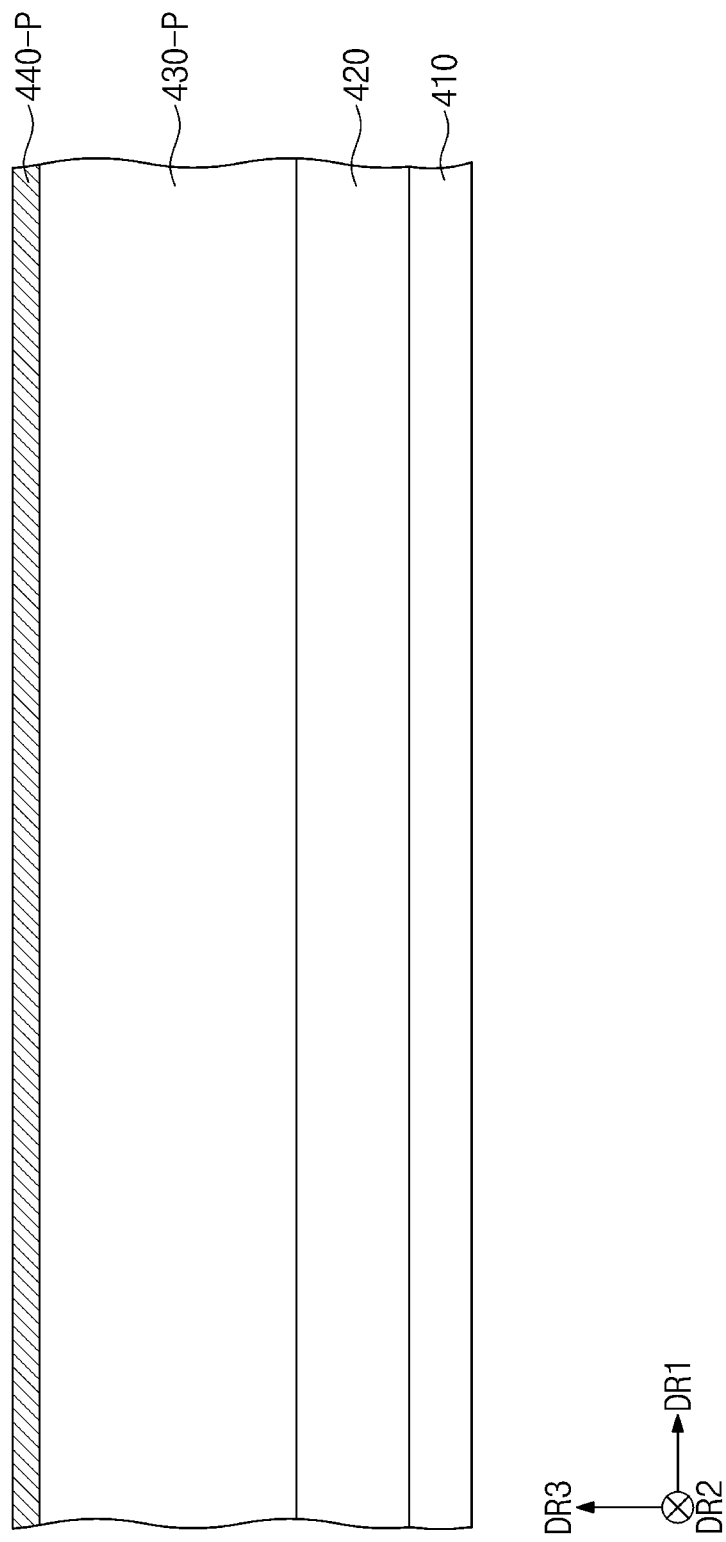
FIG. 10B illustrates a cross-sectional view showing a method of fabricating a detection sensor according to an exemplary embodiment of the present inventive concept.
Figure 10C:
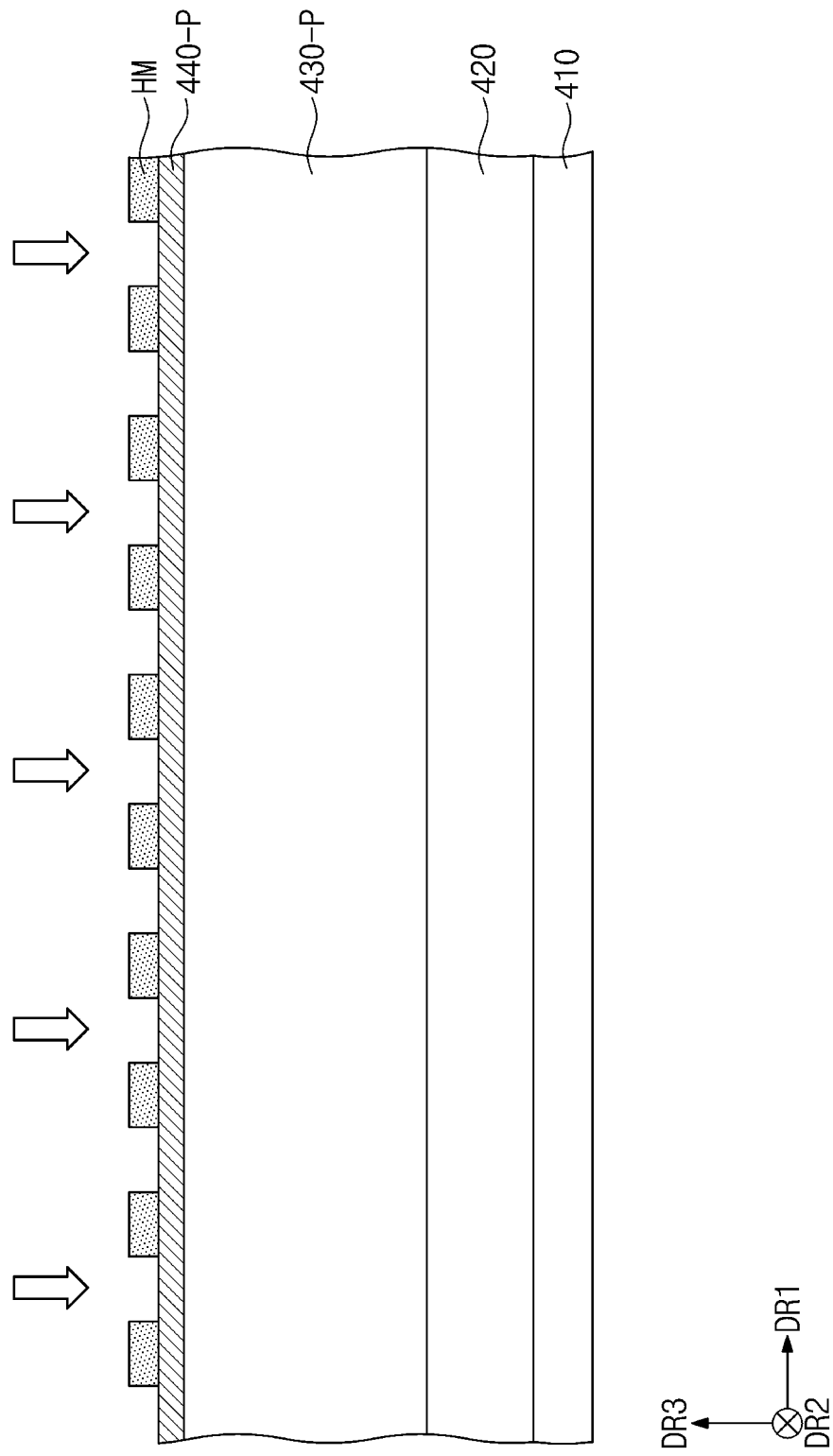
FIG. 10C illustrates a cross-sectional view showing a method of fabricating a detection sensor according to an exemplary embodiment of the present inventive concept.
Figure 10D:
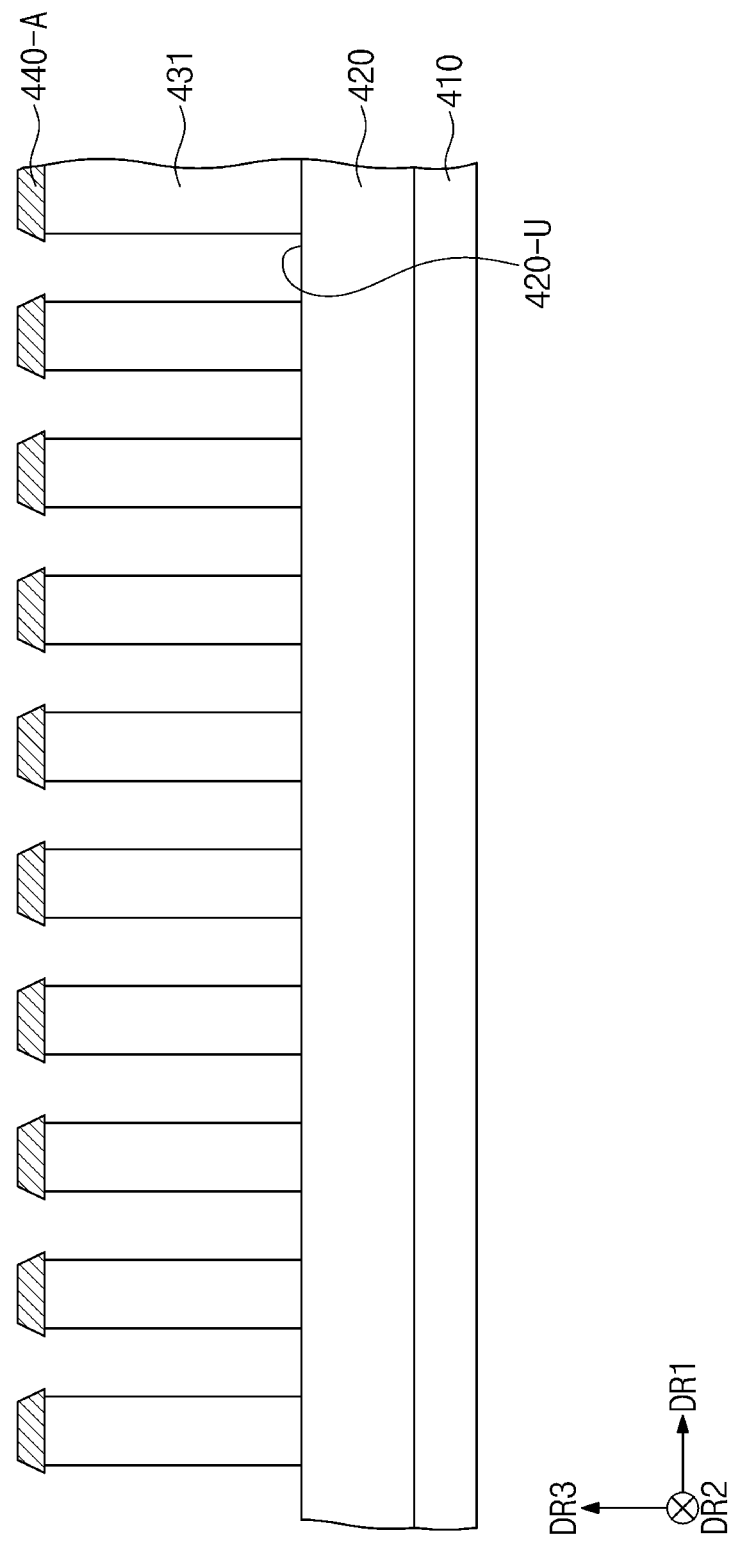
FIG. 10D illustrates a cross-sectional view showing a method of fabricating a detection sensor according to an exemplary embodiment of the present inventive concept.
Figure 10E:
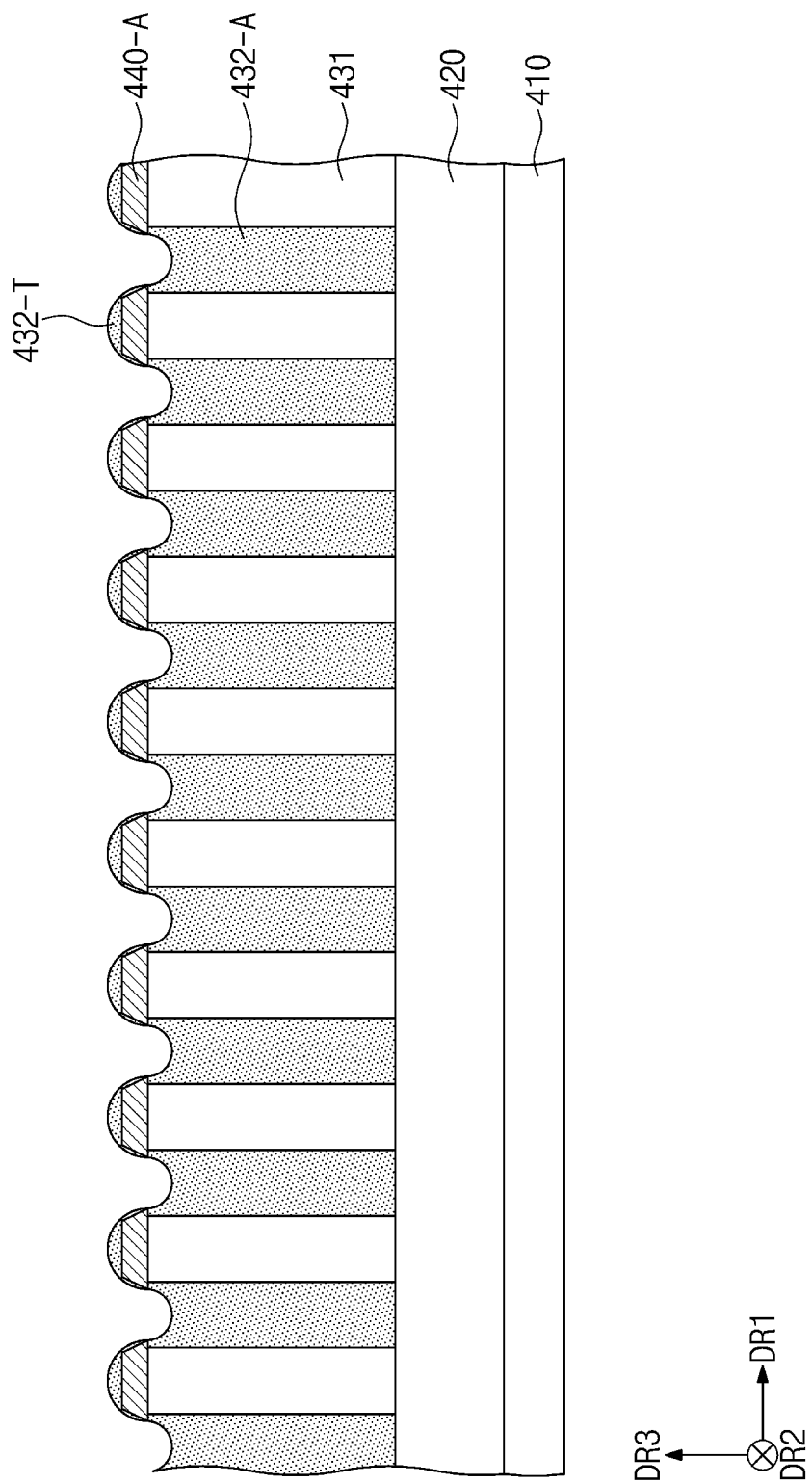
FIG. 10E illustrates a cross-sectional view showing a method of fabricating a detection sensor according to an exemplary embodiment of the present inventive concept.

FIG. 10A illustrates a cross-sectional view showing a method of fabricating a detection sensor according to an exemplary embodiment of the present inventive concept. FIG. 10B illustrates a cross-sectional view showing a method of fabricating a detection sensor according to an exemplary embodiment of the present inventive concept. FIG. 10C illustrates a cross-sectional view showing a method of fabricating a detection sensor according to an exemplary embodiment of the present inventive concept. FIG. 10D illustrates a cross-sectional view showing a method of fabricating a detection sensor according to an exemplary embodiment of the present inventive concept. FIG. 10E illustrates a cross-sectional view showing a method of fabricating a detection sensor according to an exemplary embodiment of the present inventive concept.

FIG. 10F illustrates a cross-sectional view showing a method of fabricating a detection sensor according to an exemplary embodiment of the present inventive concept.

The same reference numerals are allocated to components identical or similar to those of FIGS. 1 to 8, and a repetitive description will be omitted.

Referring to FIG. 10A, a method of fabricating a display device according to an exemplary embodiment of the present inventive concept may include a step of providing an initial optical pattern layer 430-P.

The initial optical pattern layer 430-P may be formed in a successive process on a biometric sensing layer 420 formed on a base layer 410. The initial optical pattern layer 430-P may include a material that allows light to pass therethrough.

Referring to FIG. 10B, the method may further include a step of forming an initial sensing dielectric layer 440-P. After forming the initial optical pattern layer 430-P, the initial sensing dielectric layer 440-P may be thrilled to cover the initial optical pattern layer 430-P.

Referring to FIGS. 10C and 10D, the method may include a step of forming a sensing dielectric layer 440-A and a step of forming a plurality of transmission parts 431.

The plurality of transmission parts 431 may be formed by placing a hardmask HM on the initial optical pattern layer 430-P and then etching the initial optical pattern layer 430-P. The hardmask HM may include an inorganic material. The removal of the initial optical pattern layer 430-P may expose a top surface 420-U of the biometric sensing layer 420. After etching the initial optical pattern layer 430-P, the hardmask HM may be removed. The formation of the transmission parts 431 may involve a photolithography process or a nano-imprint process.

The initial sensing dielectric layer 440-P disposed on the initial optical pattern layer 430-P may also be removed when the initial optical pattern layer 430-P is etched. The patterning of the initial sensing dielectric layer 440-P may form the sensing dielectric layer 440-A.

At this stage, from a cross-sectional view, the sensing dielectric layer 440-A may have a polygonal shape. For example, the sensing dielectric layer 440-A may have a trapezoidal shape due to a difference in etch rate between the initial optical pattern layer 430-P and the initial sensing dielectric layer 440-P.

Referring to FIG. 10E, the method may include a step of forming an initial light-shield part 432-A and 432-T. The initial light-shield part 432-A and 432-T may be formed by coating the base layer 410 with an organic material that blocks light. The organic material may be formed into an initial light-shield part 432-A filled between neighboring transmission parts 431 and an initial light-shield part 432-T coated on the transmission parts 431.

Referring to FIG. 10F, the method may include a step of forming a light-shield part 432. The light-shield part 432 may be formed by physically removing the initial light-shield part 432-T coated on the transmission parts 431.

According to the present inventive concept, as a sensing dielectric layer formed on an optical pattern layer overlaps transmission parts and includes concave-shaped dielectric patterns, when light is provided to a display module, incident light on the light-shield part may be refracted at the dielectric patterns of the sensing dielectric layer and may enter the transmission parts.

Accordingly, it may be possible to provide a detection sensor with increased optical transmittance and to provide a display device with increased accuracy or sensitivity of fingerprint recognition.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display device, comprising:
   a display module configured to display an image; and
   a detection sensor below the display module, the detection sensor including a base layer, a biometric sensing layer on the base layer, an optical pattern layer on the biometric sensing layer, and a sensing dielectric layer on the optical pattern layer,
   wherein the optical pattern layer includes:
      a plurality of transmission parts that provide the biometric sensing layer with light that is externally incident through the display module; and
      a light-shield part that at least partially surrounds the plurality of transmission parts,
   wherein the light-shield part includes a plurality of light-shield patterns that are recessed in a direction toward the base layer,
   wherein each of the recessed portions of the plurality of light-shield patterns has a concave shape in a direction from an upper surface in contact with the sensing dielectric layer of the light-shield part toward a bottom surface in contact with the biometric sensing layer of the light-shield part.

2. The display device of claim 1, wherein the sensing dielectric layer includes a plurality of dielectric patterns that are recessed in a same direction in which the light-shield patterns are recessed.

3. The display device of claim 2, wherein the dielectric patterns overlap the light-shield patterns.

4. The display device of claim 3, wherein, when the light is externally incident through the display module, incident light on the light-shield part is refracted at the dielectric patterns and enters the transmission parts.

5. The display device of claim 2, wherein the sensing dielectric layer covers the optical pattern layer.

6. The display device of claim 1, wherein the sensing dielectric layer is disposed on the transmission parts, overlaps a portion of the light-shield part, and exposes a remaining portion of the light-shield part.

7. The display device of claim 5, wherein the sensing dielectric layer disposed on the transmission parts has a polygonal shape.

8. The display device of claim 7, wherein, when the light is incident through the display module, incident light on the light-shield part is refracted at the sensing dielectric layer and enters the transmission parts.

9. The display device of claim 1, wherein a distance from the biometric sensing layer to the light-shield patterns varies.

10. The display device of claim 1, wherein each of the light-shield patterns has a concave shape in the direction toward the base layer.

11. The display device of claim 1, wherein the sensing dielectric layer includes at least one of a resin or an inorganic material.

12. The display device of claim 1, wherein the transmission parts are disposed on the light-shield part and are spaced apart from each other along a first direction and a second direction that intersects the first direction.

13. The display device of claim 1, wherein a refractive index of the sensing dielectric layer is equal to or greater than about 1.65.

14. The display device of claim 1, wherein the biometric sensing layer includes:
- a transistor disposed on the base layer and including a plurality of electrodes; and
- a sensing element connected to the transistor.

15. A method of fabricating a display device, the method comprising:
- forming a base layer;
- forming a biometric sensing layer on the base layer;
- forming an initial optical pattern layer on the biometric sensing layer;
- patterning the initial optical pattern layer to form a plurality of transmission parts that are spaced apart from each other;
- coating the base layer with a light-shielding material to form an initial light-shield part between adjacent transmission parts of the plurality of transmission parts and on top surfaces of the plurality of transmission parts; and
- forming a light-shield part by removing portions of the initial light-shield part that are formed on the top surfaces of the transmission parts,
- wherein the light-shield part includes a plurality of light-shield patterns each having a concave shape protruding in a direction toward the base layer, wherein the concave shape is disposed between adjacent transmission parts.

16. The method of claim 15, further comprising, after forming the light-shield part, forming a sensing dielectric layer that covers the transmission parts and the light-shield part,
- wherein the sensing dielectric layer includes a plurality of dielectric patterns each having a concave shape protruding in the same direction in which the light-shield patterns protrude.

17. The method of claim 16, wherein the dielectric patterns overlap the light-shield patterns.

18. The method of claim 15, further comprising, after forming the initial optical pattern layer, forming an initial sensing dielectric layer on the initial optical pattern layer.

19. The method of claim 18, wherein, when the initial optical pattern layer is patterned, the initial sensing dielectric layer is simultaneously patterned to form a sensing dielectric layer that covers the transmission parts.

20. The method of claim 19, wherein the sensing dielectric layer includes at least one of a resin or an inorganic material.

* * * * *